(12) United States Patent
Upadhya et al.

(10) Patent No.: US 7,599,184 B2
(45) Date of Patent: Oct. 6, 2009

(54) LIQUID COOLING LOOPS FOR SERVER APPLICATIONS

(75) Inventors: Girish Upadhya, Cupertino, CA (US); Mark Munch, Los Alos Hills, CA (US); Norman Chow, Milpitas, CA (US); Paul Tsao, Los Altos, CA (US); Douglas E. Werner, Santa Clara, CA (US); Mark McMaster, Menlo Park, CA (US); Frederic Landry, San Francisco, CA (US); Ian Spearing, Westerville, OH (US); Tim Schrader, Irwin, OH (US)

(73) Assignee: Cooligy Inc., Mountain View, CA (US)

( * ) Notice: Subject to any disclaimer, the term of this patent is extended or adjusted under 35 U.S.C. 154(b) by 0 days.

(21) Appl. No.: 11/707,350

(22) Filed: Feb. 16, 2007

(65) Prior Publication Data

US 2007/0201204 A1    Aug. 30, 2007

Related U.S. Application Data

(60) Provisional application No. 60/774,764, filed on Feb. 16, 2006.

(51) Int. Cl.
*H05K 7/20* (2006.01)
(52) U.S. Cl. .................. 361/699; 361/695; 361/704; 361/727; 165/80.4; 165/104.33; 174/15.1
(58) Field of Classification Search .................. None
See application file for complete search history.

(56) References Cited

U.S. PATENT DOCUMENTS 2,039,593 A    5/1936    Hubbuch et al.

(Continued)

FOREIGN PATENT DOCUMENTS

CN    97212126.9    3/1997

(Continued)

OTHER PUBLICATIONS

Stephen C. Jacobson et al., "Fused Quartz Substrates for Microchip Electrophoresis", Analytical Chemistry, vol. 67, No. 13, Jul. 1, 1995, pp. 2059-2063.

(Continued)

*Primary Examiner*—Boris L Chervinsky
(74) *Attorney, Agent, or Firm*—Haverstock & Owens LLP

(57) ABSTRACT

Liquid-based cooling solutions used to transfer heat produced by one or more heat generating devices from one or more electronics servers to the ambient. Each electronics server includes one or more heat generating devices. Integrated onto each electronics server is a liquid based cooling system. Each liquid based cooling system includes a server pump and one or more microchannel cold plates (MCP) coupled together via fluid lines. The liquid based cooling system for each electronics server includes a rejector plate configured with micro-channels. The MCPs, the server pump and the rejector plate form a first closed loop. The rejector plate is coupled to a chassis cold plate via a thermal interface material. In a multiple electronics server configuration, the rejector plates for each of the electronics servers are coupled to the chassis cold plate configured with fluid channels which are coupled via fluid lines to a liquid-to-air heat exchanging system to form a second closed loop.

54 Claims, 5 Drawing Sheets

U.S. PATENT DOCUMENTS

| | | |
|---|---|---|
| 3,361,195 A | 1/1968 | Meyerhoff et al. |
| 3,771,219 A | 11/1973 | Tuzi et al. .................... 29/583 |
| 3,817,321 A | 6/1974 | von Cube et al. ........... 165/105 |
| 3,852,806 A | 12/1974 | Corman et al. ................ 357/82 |
| 3,878,083 A | 4/1975 | De Nora et al. ............. 204/290 |
| 3,923,426 A | 12/1975 | Theeuwes .................... 417/48 |
| 3,948,316 A | 4/1976 | Souriau ...................... 165/105 |
| 3,993,123 A | 11/1976 | Chu et al. ..................... 165/80 |
| 4,032,415 A | 6/1977 | Sanders ....................... 204/78 |
| 4,109,707 A | 8/1978 | Wilson et al. ................. 165/46 |
| 4,203,488 A | 5/1980 | Johnson et al. ............... 165/80 |
| 4,235,285 A | 11/1980 | Johnson et al. ............... 165/80 |
| 4,296,455 A | 10/1981 | Leaycraft et al. ............ 361/383 |
| 4,312,012 A | 1/1982 | Freiser et al. ................. 357/82 |
| 4,332,291 A | 6/1982 | Mulock-Bentley ........... 165/76 |
| 4,345,267 A | 8/1982 | Corman et al. ................ 357/81 |
| 4,392,362 A | 7/1983 | Little |
| 4,450,472 A | 5/1984 | Tuckerman et al. ........... 357/82 |
| 4,467,861 A | 8/1984 | Kiseev et al. .......... 165/104.22 |
| 4,485,429 A | 11/1984 | Mittal ........................ 361/386 |
| 4,516,632 A | 5/1985 | Swift et al. ................. 165/167 |
| 4,540,115 A | 9/1985 | Hawrylo ...................... 228/123 |
| 4,561,040 A | 12/1985 | Eastman et al. ............. 361/385 |
| 4,567,505 A | 1/1986 | Pease et al. ................... 357/81 |
| 4,568,431 A | 2/1986 | Polan et al. ................... 204/13 |
| 4,573,067 A | 2/1986 | Tuckerman et al. ........... 357/82 |
| 4,574,876 A | 3/1986 | Aid ............................. 165/46 |
| 4,716,494 A | 12/1987 | Bright et al. ................. 361/386 |
| 4,758,926 A | 7/1988 | Herrell et al. ................ 361/385 |
| 4,791,983 A | 12/1988 | Nicol et al. ................ 165/80.4 |
| 4,793,405 A | 12/1988 | Diggelmann et al. ... 165/104.33 |
| 4,866,570 A | 9/1989 | Porter ........................ 361/382 |
| 4,868,712 A | 9/1989 | Woodman .................... 361/388 |
| 4,884,331 A | 12/1989 | Hinshaw ...................... 29/558 |
| 4,894,709 A | 1/1990 | Phillips et al. ................. 357/82 |
| 4,896,719 A | 1/1990 | O'Neill et al. ............... 165/170 |
| 4,903,761 A | 2/1990 | Cima .................... 165/104.25 |
| 4,908,112 A | 3/1990 | Pace ........................... 204/299 |
| 4,938,280 A | 7/1990 | Clark ........................ 165/80.4 |
| 4,978,638 A | 12/1990 | Buller et al. ................. 437/209 |
| 5,009,760 A | 4/1991 | Zare et al. ................. 204/183.3 |
| 5,016,090 A | 5/1991 | Galyon et al. ................. 357/82 |
| 5,016,138 A | 5/1991 | Woodman .................... 361/381 |
| 5,043,797 A | 8/1991 | Lopes ......................... 357/82 |
| 5,057,908 A | 10/1991 | Weber ......................... 357/81 |
| 5,070,040 A | 12/1991 | Pankove ...................... 437/209 |
| 5,083,194 A | 1/1992 | Bartilson ...................... 357/81 |
| 5,088,005 A | 2/1992 | Ciaccio ....................... 361/385 |
| 5,099,311 A | 3/1992 | Bonde et al. .................. 357/82 |
| 5,099,910 A | 3/1992 | Walpole et al. ............ 165/80.4 |
| 5,105,430 A | 4/1992 | Mundinger et al. ........... 372/35 |
| 5,125,451 A | 6/1992 | Matthews .................. 165/80.4 |
| 5,131,233 A | 7/1992 | Cray et al. ..................... 62/64 |
| 5,161,089 A | 11/1992 | Chu et al. ................... 361/385 |
| 5,203,401 A | 4/1993 | Hamburgen et al. ...... 165/80.4 |
| 5,218,515 A | 6/1993 | Bernhardt ................... 361/385 |
| 5,228,502 A | 7/1993 | Chu et al. .................. 165/80.4 |
| 5,232,047 A | 8/1993 | Matthews ................... 165/168 |
| 5,239,200 A | 8/1993 | Messina et al. ............. 257/714 |
| 5,239,443 A | 8/1993 | Fahey et al. ................. 361/689 |
| 5,247,800 A | 9/1993 | Mruzek et al. ............... 62/51.1 |
| 5,263,251 A | 11/1993 | Matthews ............. 29/840.036 |
| 5,265,670 A | 11/1993 | Zingher ..................... 165/80.4 |
| 5,269,372 A | 12/1993 | Chu et al. .................. 165/80.4 |
| 5,274,920 A | 1/1994 | Matthews ............. 29/890.039 |
| 5,275,237 A | 1/1994 | Rolfson et al. ............. 265/80.5 |
| 5,294,834 A | 3/1994 | Fatemi et al. ............... 257/745 |
| 5,299,635 A | 4/1994 | Abraham .................... 165/173 |
| 5,307,236 A | 4/1994 | Rio et al. .................... 361/720 |
| 5,308,429 A | 5/1994 | Bradley ................... 156/306.6 |
| 5,309,319 A | 5/1994 | Messina ..................... 361/699 |
| 5,310,440 A | 5/1994 | Zingher ...................... 156/345 |
| 5,316,077 A | 5/1994 | Reichard ............... 165/104.28 |
| 5,317,805 A | 6/1994 | Hoopman et al. ......... 29/890.03 |
| 5,325,265 A | 6/1994 | Turlik et al. ................. 361/702 |
| 5,346,000 A | 9/1994 | Schlitt .................... 165/104.26 |
| 5,380,956 A | 1/1995 | Loo et al. .................... 174/252 |
| 5,383,340 A | 1/1995 | Larson et al. .................. 62/259 |
| 5,388,635 A | 2/1995 | Gruber et al. .............. 165/80.4 |
| 5,397,919 A | 3/1995 | Tata et al. .................... 257/717 |
| 5,421,943 A | 6/1995 | Tam et al. ................. 156/273.9 |
| 5,424,918 A | 6/1995 | Felps et al. .................. 361/704 |
| 5,427,174 A | 6/1995 | Lomolino, Sr. et al. ...... 165/0.1 |
| 5,436,793 A | 7/1995 | Sanwo et al. ................ 361/689 |
| 5,459,099 A | 10/1995 | Hsu .......................... 437/180 |
| 5,490,117 A | 2/1996 | Oda et al. .................... 365/226 |
| 5,508,234 A | 4/1996 | Dusablon, Sr. et al. ...... 437/228 |
| 5,514,832 A | 5/1996 | Dusablon, Sr. et al. ..... 174/15.1 |
| 5,514,906 A | 5/1996 | Love et al. .................. 257/712 |
| 5,520,244 A | 5/1996 | Mundinger et al. .... 165/104.33 |
| 5,534,328 A | 7/1996 | Ashmead et al. |
| 5,544,696 A | 8/1996 | Leland ....................... 165/80.4 |
| 5,548,605 A | 8/1996 | Benett et al. .................. 372/36 |
| 5,575,929 A | 11/1996 | Yu et al. ....................... 216/10 |
| 5,585,069 A | 12/1996 | Zanzucchi et al. .......... 422/100 |
| 5,641,400 A | 6/1997 | Kaltenbach et al. ...... 210/198.2 |
| 5,647,429 A | 7/1997 | Oktay et al. |
| 5,670,033 A | 9/1997 | Burgess et al. ................ 205/74 |
| 5,675,473 A | 10/1997 | McDunn et al. ............. 361/699 |
| 5,685,966 A | 11/1997 | Aaron et al. ................. 204/600 |
| 5,692,558 A | 12/1997 | Hamilton et al. ........... 165/80.4 |
| 5,696,405 A | 12/1997 | Weld .......................... 257/714 |
| 5,726,495 A | 3/1998 | Aihara et al. ............... 257/722 |
| 5,727,618 A | 3/1998 | Mundinger et al. ........ 165/80.4 |
| 5,731,954 A | 3/1998 | Cheon ........................ 361/699 |
| 5,740,013 A | 4/1998 | Roesner et al. ............. 361/697 |
| 5,761,037 A | 6/1998 | Anderson et al. ........... 361/700 |
| 5,763,951 A | 6/1998 | Hamilton et al. ............ 257/714 |
| 5,768,104 A | 6/1998 | Salmonson et al. ......... 361/704 |
| 5,774,779 A | 6/1998 | Tuchinskiy ................... 419/2 |
| 5,788,819 A | 8/1998 | Onishi et al. ................ 205/155 |
| 5,800,690 A | 9/1998 | Chow et al. ................. 204/451 |
| 5,801,442 A | 9/1998 | Hamilton et al. ............ 257/714 |
| 5,811,062 A | 9/1998 | Wegeng et al. .............. 422/129 |
| 5,829,514 A | 11/1998 | Smith et al. ................... 165/78 |
| 5,830,806 A | 11/1998 | Hudson et al. .............. 438/690 |
| 5,835,345 A | 11/1998 | Staskus et al. .............. 361/699 |
| 5,858,188 A | 1/1999 | Soane et al. ................. 204/454 |
| 5,863,708 A | 1/1999 | Zanzucchi et al. .......... 430/320 |
| 5,870,823 A | 2/1999 | Bezama et al. ................ 29/848 |
| 5,874,795 A | 2/1999 | Sakamoto ................... 310/156 |
| 5,880,524 A | 3/1999 | Xie ............................ 257/404 |
| 5,886,870 A | 3/1999 | Omori ........................ 361/704 |
| 5,901,037 A | 5/1999 | Hamilton et al. ............ 361/699 |
| 5,921,087 A | 7/1999 | Bhatia et al. .................. 62/3.2 |
| 5,927,390 A | 7/1999 | Lehman ...................... 165/122 |
| 5,936,192 A | 8/1999 | Tauchi ........................ 136/203 |
| 5,945,217 A | 8/1999 | Hanrahan ................... 428/389 |
| 5,964,092 A | 10/1999 | Tozuka et al. ................. 62/3.7 |
| 5,965,001 A | 10/1999 | Chow et al. ................. 204/600 |
| 5,978,220 A | 11/1999 | Frey et al. ................... 361/699 |
| 5,983,997 A | 11/1999 | Hou .......................... 165/144 |
| 5,993,750 A | 11/1999 | Ghosh et al. ................. 422/191 |
| 5,997,713 A | 12/1999 | Beetz et al. ................. 205/124 |
| 5,998,240 A | 12/1999 | Hamilton et al. ........... 438/122 |
| 6,007,309 A | 12/1999 | Hartley ....................... 417/322 |
| 6,012,902 A | 1/2000 | Parce |
| 6,014,312 A | 1/2000 | Schulz-Harder et al. .... 361/699 |
| 6,019,165 A | 2/2000 | Batchelder ................. 165/80.3 |
| 6,069,791 A | 5/2000 | Goto et al. |
| 6,084,178 A | 7/2000 | Cromwell .................... 174/35 |
| 6,086,330 A | 7/2000 | Press et al. .................. 416/223 |
| 6,101,715 A | 8/2000 | Fuesser et al. ........... 29/890.03 |
| 6,105,373 A | 8/2000 | Watanabe et al. .............. 62/3.7 |

| | | | | | | |
|---|---|---|---|---|---|---|
| 6,166,907 A | 12/2000 | Chien .................... 361/699 | | 2002/0121105 A1 | 9/2002 | McCarthy et al. ............. 62/500 |
| 6,227,287 B1 | 5/2001 | Tanaka et al. ............. 165/80.4 | | 2002/0134543 A1 | 9/2002 | Estes et al. .................. 165/277 |
| 6,234,240 B1 | 5/2001 | Cheon | | 2003/0097846 A1 | 5/2003 | Novotny et al. ............... 62/3.7 |
| 6,238,538 B1 | 5/2001 | Parce | | 2003/0123228 A1 | 7/2003 | Bhatia et al. ................ 361/705 |
| 6,293,333 B1 | 9/2001 | Ponnappan et al. | | 2003/0205363 A1 | 11/2003 | Chu et al. |
| 6,324,075 B1 | 11/2001 | Unrein et al. ............. 361/816 | | 2004/0008483 A1* | 1/2004 | Cheon ....................... 361/687 |
| 6,351,384 B1 | 2/2002 | Daikoku et al. ............ 361/704 | | 2004/0052049 A1 | 3/2004 | Wu et al. .................... 361/699 |
| 6,360,814 B1 | 3/2002 | Tanaka et al. .......... 165/104.33 | | 2004/0099410 A1 | 5/2004 | Ghosh ........................ 165/185 |
| 6,366,462 B1 | 4/2002 | Chu et al. .................. 361/699 | | 2004/0112585 A1 | 6/2004 | Goodson et al. ............. 165/299 |
| 6,367,544 B1 | 4/2002 | Calaman .................... 165/135 | | 2004/0126863 A1 | 7/2004 | Fidock et al. ................ 435/196 |
| 6,381,846 B2 | 5/2002 | Insley et al. ............. 29/890.039 | | 2004/0188076 A1 | 9/2004 | Lee ............................ 165/174 |
| 6,385,044 B1 | 5/2002 | Colbert et al. ............. 361/700 | | 2004/0206477 A1 | 10/2004 | Kenny et al. ............... 165/80.4 |
| 6,396,706 B1 | 5/2002 | Wohlfarth .................. 361/760 | | 2004/0221604 A1 | 11/2004 | Ota et al. .................... 62/259.2 |
| 6,397,932 B1 | 6/2002 | Calaman et al. ............ 165/80.4 | | 2005/0082666 A1 | 4/2005 | Lee et al. .................... 257/728 |
| 6,431,260 B1 | 8/2002 | Agonafer et al. | | 2005/0083657 A1 | 4/2005 | Hamman ................... 361/699 |
| 6,449,162 B1 | 9/2002 | Corbin, Jr. et al. .......... 361/719 | | 2005/0117298 A1 | 6/2005 | Koga et al. .................. 361/699 |
| 6,457,515 B1 | 10/2002 | Vafai et al. ................. 165/80.4 | | 2005/0133200 A1 | 6/2005 | Malone et al. .............. 165/80.4 |
| 6,469,893 B1 | 10/2002 | Frutschy et al. ............. 361/700 | | 2005/0231914 A1 | 10/2005 | Mikubo et al. .............. 361/699 |
| 6,478,258 B1 | 11/2002 | Yee ........................... 244/163 | | 2005/0247433 A1 | 11/2005 | Corrado et al. ............. 165/80.4 |
| 6,519,148 B2 | 2/2003 | Nakagawa et al. | | 2005/0257532 A1 | 11/2005 | Ikeda et al. ................. 62/3.7 |
| 6,533,840 B2 | 3/2003 | Martin et al. | | 2005/0259393 A1 | 11/2005 | Vinson et al. ............... 361/690 |
| 6,536,510 B2* | 3/2003 | Khrustalev et al. ...... 165/104.33 | | 2005/0270742 A1 | 12/2005 | Brewer et al. ............... 361/696 |
| 6,643,132 B2* | 11/2003 | Faneuf et al. ............... 361/700 | | 2006/0037739 A1 | 2/2006 | Utsunomiya ........... 165/104.33 |
| 6,657,121 B2* | 12/2003 | Garner ...................... 174/16.3 | | 2006/0056156 A1 | 3/2006 | Long et al. .................. 361/704 |
| 6,679,315 B2 | 1/2004 | Cosley et al. ............... 165/80.4 | | 2006/0060333 A1 | 3/2006 | Chordia et al. .......... 165/104.33 |
| 6,700,785 B2 | 3/2004 | Berry et al. .................. 361/726 | | 2006/0102999 A1 | 5/2006 | Tustaniwskyi et al. ...... 257/688 |
| 6,757,169 B2 | 6/2004 | Kondo et al. ................. 361/699 | | 2006/0120039 A1 | 6/2006 | Yuval |
| 6,763,880 B1 | 7/2004 | Shih ........................ 165/80.4 | | 2006/0133039 A1 | 6/2006 | Belady ....................... 361/699 |
| 6,787,052 B1 | 9/2004 | Vaganov | | 2006/0137863 A1 | 6/2006 | Lee et al. ................. 165/104.33 |
| 6,795,312 B2 | 9/2004 | Narakino et al. ............. 361/687 | | 2006/0139882 A1 | 6/2006 | Mikubo et al. .............. 361/699 |
| 6,796,372 B2* | 9/2004 | Bear ...................... 165/104.21 | | 2006/0171113 A1 | 8/2006 | Wu |
| 6,807,056 B2* | 10/2004 | Kondo et al. ................ 361/689 | | 2006/0187639 A1 | 8/2006 | Carswell .................... 361/699 |
| 6,819,563 B1 | 11/2004 | Chu et al. | | 2006/0232945 A1 | 10/2006 | Chu et al. |
| 6,826,922 B2 | 12/2004 | Patel et al. .................... 62/185 | | 2007/0042514 A1 | 2/2007 | Wu et al. |
| 6,829,142 B2* | 12/2004 | Belady et al. ............... 361/687 | | 2007/0053161 A1 | 3/2007 | Giardina et al. |
| 6,836,131 B2 | 12/2004 | Cader et al. ................ 324/760 | | 2007/0098143 A1 | 5/2007 | Thangamani et al. |
| 6,881,039 B2 | 4/2005 | Corbin et al. | | 2007/0115634 A1 | 5/2007 | Laing ......................... 361/699 |
| 6,903,929 B2 | 6/2005 | Prasher et al. ............... 361/699 | | 2007/0267181 A1 | 11/2007 | Lin et al. |
| 6,942,018 B2* | 9/2005 | Goodson et al. ............. 165/80.4 | | 2007/0297136 A1 | 12/2007 | Konshak |
| 6,950,303 B2 | 9/2005 | Neho et al. | | 2008/0013283 A1 | 1/2008 | Gilbert et al. ............... 361/715 |
| 6,955,212 B1 | 10/2005 | Hsieh ....................... 165/80.4 | | 2008/0018212 A1 | 1/2008 | Spearing et al. |
| 6,967,842 B2* | 11/2005 | Aoki et al. .................. 361/701 | | 2008/0024992 A1 | 1/2008 | Pflueger |
| 6,986,382 B2 | 1/2006 | Upadhya et al. ............ 165/80.4 | | | | |
| 6,988,534 B2 | 1/2006 | Kenny et al. | | | | |
| 6,988,535 B2 | 1/2006 | Upadhya et al. | | | FOREIGN PATENT DOCUMENTS | |
| 6,992,891 B2 | 1/2006 | Mallik et al. ............... 361/704 | | | | |
| 6,994,151 B2 | 2/2006 | Zhou et al. | | DE | 42 42 841 A1 | 11/1997 |
| 7,000,684 B2 | 2/2006 | Kenny et al. ............... 165/80.4 | | DE | 35406777 1 | 1/2001 |
| 7,009,843 B2 | 3/2006 | Lee et al. ................... 361/704 | | EP | 1 003 006 A1 | 5/2000 |
| 7,017,654 B2 | 3/2006 | Kenny et al. | | EP | 1153690 A1 | 11/2001 |
| 7,021,369 B2 | 4/2006 | Werner et al. | | EP | 1 520 993 A2 | 6/2005 |
| 7,044,196 B2 | 5/2006 | Shook et al. | | JP | 5304383 AA | 11/1993 |
| 7,086,839 B2 | 8/2006 | Kenny et al. | | JP | 6-326226 | 11/1994 |
| 7,120,021 B2* | 10/2006 | Hamman ................... 361/699 | | JP | 9-102568 | 4/1997 |
| 7,154,749 B2* | 12/2006 | Stefanoski et al. .......... 361/695 | | JP | 10223811 | 8/1998 |
| 7,156,159 B2 | 1/2007 | Lovette et al. | | JP | 2000-277540 | 10/2000 |
| 7,184,269 B2* | 2/2007 | Campbell et al. ........... 361/700 | | JP | 306614 | 3/2005 |
| 7,243,704 B2 | 7/2007 | Tustaniwskyi et al. ......... 165/80 | | TW | 183247 | 5/1992 |
| 7,254,957 B2* | 8/2007 | Weber et al. ................ 62/259.2 | | TW | 402680 | 9/2000 |
| 7,278,549 B2 | 10/2007 | Munch et al. | | TW | 449040 | 8/2001 |
| 7,280,363 B2 | 10/2007 | Reyzin et al. ............... 361/719 | | TW | 49131 | 6/2002 |
| 7,301,773 B2 | 11/2007 | Brewer et al. .............. 361/719 | | TW | 495062 | 7/2002 |
| 7,325,588 B2 | 2/2008 | Malone et al. | | TW | 0502102 B | 9/2002 |
| 7,334,630 B2 | 2/2008 | Goodson et al. ....... 165/104.33 | | TW | 510490 | 11/2002 |
| 7,342,789 B2 | 3/2008 | Hall et al. | | TW | 0306614 Y | 2/2007 |
| 7,449,122 B2 | 11/2008 | Corbin et al. | | | | |
| 7,462,852 B2 | 12/2008 | Appleby et al. | | | | |
| 2001/0042616 A1 | 11/2001 | Baer | | | OTHER PUBLICATIONS | |
| 2002/0031948 A1 | 3/2002 | Yasufuku et al. ............. 439/625 | | | | |
| 2002/0039279 A1 | 4/2002 | Ishikawa et al. | | Kendra V. Sharp et al., "Liquid Flows in Microchannels", 2002, vol. | | |
| 2002/0051341 A1 | 5/2002 | Frutschy et al. ............. 361/700 | | 6, pp. 6-1 to 6-38. | | |
| 2002/0079095 A1 | 6/2002 | Davies et al. | | Shuchi Shoji et al., "Microflow devices and systems", J. Micromech. | | |
| 2002/0080578 A1 | 6/2002 | Xie | | Microeng. 4(1994), pp. 157-171, printed in the U.K. | | |

Angela Rasmussen et al., "Fabrication Techniques to Realize CMOS-Compatible Microfluidic Microchannels", Journal of Microelectromechanical Systems, Vo. 10, No. 2, Jun. 2001, pp. 286-297.

J. H. Wang et al., "Thermal-Hydraulic Characteristic of Micro Heat Exchangers", 1991, DSC-vol. 32, Micromechanical Sensors, Actuators, and Systems, pp. 331-339.

Gad Hetsroni et al., "Nonuniform Temperature Distribution in Electronic Devices Cooled by Flow in Parallel Microchannels", IEEE Transactions on Components and Packaging Technologies, Mar. 2001, vol. 24, No. 1, pp. 16-23.

X. F. Peng et al., "Heat Transfer Characteristics of Water Flowing through Microchannels", Experimental Heat Transfer An International Journal, vol. 7, No. 4, Oct.-Dec. 1994, pp. 265-283.

Linan Jiang et al., "Forced Convection Boiling in a Microchannel Heat Sink", Journal of Microelectromechanical Systems, vol. 10, No. 1, Mar. 2001, pp. 80-87.

Muhammad M. Rahman et al., "Experimental Measurements of Fluid Flow and Heat Transfer in Microchannel Cooling Passages in a Chip Substrate", 1993, EEP-vol. 4-2, Advances in Electronic Packaging, pp. 685-692.

X. F. Peng et al., "Forced convection and flow boiling heat transfer for liquid flowing through Microchannels", 1993, Int. J. Heat Mass Transfer, vol. 36, No. 14, pp. 3421-3427.

Lung-Jieh Yang et al., "A Micro Fluidic System of Micro Channels with On-Site Sensors by Silicon Bulk Micromachining", Sep. 1999, Microfluidic Devices and Systems II, vol. 3877, pp. 267-272.

G. Mohiuddin Mala et al., "Heat transfer and fluid flow in microchannels", 1997, Int. J. Heat Mass transfer, vol. 40, No. 13, pp. 3079-3088, printed in Great Britain.

Linan Jiang et al., "A Micro-Channel Heat Sink with Integrated Temperature Sensors for Phase Transition Study", IEEE 1999, pp. 159-164.

Linan Jiang et al., "Fabrication and characterization of a microsystem for a micro-scale heat transfer study", J. Micromech. Microeng. 9 (1999) pp. 422-428, printed in the U.K.

M. B. Bowers et al., "High flux boiling in low flow rate, low pressure drop mini-channel and micro-channel heat sinks", 1994, Int. J. Heat Mass Transfer, vol. 37, No. 2, pp. 321-332.

Yogendra Joshi, "Heat out of small packages", Dec. 2001, Mechanical Engineering, pp. 56-58.

A. Rostami et al., "Liquid Flow and Heat Transfer in Microchannels: A Review", 2000, Heat and Technology, vol. 18, No. 2, pp. 59-68.

Lian Zhang et al., "Measurements and Modeling of Two-Phase Flow in Microchannels with Nearly Constant Heat Flux Boundary Conditions", Journal of Microelectromechanical Systems, vol. 11, No. 1, Feb. 2002, pp. 12-19.

Muhammad Mustafizur Rahman, "Measurements of Heat Transfer in Microchannel Heat Sinks", Int. Comm. Heat Mass Transfer, vol. 27, No. 4, May 2000, pp. 495-506.

Issam Mudawar et al., "Enhancement of Critical Heat Flux from High Power Microelectronic Heat Sources in a Flow Channel", Journal of Electronic Packaging, Sep. 1990, vol. 112, pp. 241-248.

Nelson Kuan, "Experimental Evaluation of Micro Heat Exchangers Fabricated in Silicon", 1996, HTD-vol. 331, National Heat Transfer Conference, vol. 9, pp. 131-136.

E. W. Kreutz et al., "Simulation of micro-channel heat sinks for optoelectronic microsystems", Microelectronics Journal 31(2000), pp. 787-790.

J. C. Y. Koh et al., "Heat Transfer of Microstructures for Integrated Circuits", 1986, Int. Comm. Heat Mass Transfer, vol. 13, pp. 89-98.

Snezana Konecni et al., "Convection Cooling of Microelectronic Chips", 1992, InterSociety Conference on Thermal Phenomena, pp. 138-144.

Michael B. Kleiner et al., "High Performance Forced Air Cooling Scheme Employing Microchannel Heat Exchangers", Dec. 1995, IEEE Transactions on Components, Packaging, and Manufacturing Technology-Part A, vol. 18, No. 4, pp. 795-804.

Jerry K. Keska Ph. D. et al., "An Experimental Study on an Enhanced Microchannel Heat Sink for Microelectronics Applications", EEP-vol. 26-2, Advances in Electronic Packaging, 1999, vol. 2, pp. 1235-1259.

Shung-Wen Kang et al., "The Performance Test and Analysis of Silicon-Based Microchannel Heat Sink", Jul. 1999, Terahertz and Gigahertz Photonics, vol. 3795, pp. 259-270.

Joseph C. Tramontana, "Semiconductor Laser Body Heat Sink", Xerox Disclosure Journal, vol. 10, No. 6, Nov./Dec. 1985, pp. 379-381.

Sarah Arulanandam et al., "Liquid transport in rectangular microchannels by electroosmotic pumping", Colloids and Surfaces A: Physicochemical and Engineering Aspects 161 (2000), pp. 89-102.

Jeffery D. Barner et al., "Thermal Ink Jet Print Head Carriage with Integral Liquid Cooling Capabilities", Xerox Disclosure Journal-vol. 21, No. 1. Jan./Feb. 1996, pp. 33-34.

"Autonomous displacement of a solution in a microchannel by another solution", Research Disclosure, Jun. 2001, pp. 1046-1047.

John M. Waldvogel, "Aluminum Silicon Carbide Phase Change Heat Spreader", Motorola, Jun. 1999, Technical Developments, pp. 226-230.

James P. Slupe et al., "An idea for maintaining a stable thermal environment for electronic devices", Research Disclosure, Aug. 2001, p. 1312.

John M. Waldvogel, "A Heat Transfer Enhancement Method for Forced Convection Bonded-Fin Heatsinks", Motorola, Dec. 1997, Technical Developments, pp. 158-159.

"Thin Heat Pipe for Cooling Components on Printed Circuit Boards", IBM Technical Disclosure Bulletin, vol. 34, No. 7B, Dec. 1991, pp. 321-322.

R. C. Chu et al., "Process for Nucleate Boiling Enhancement", IBM Technical Disclosure Bulletin, vol. 18, No. 7, Dec. 1975, p. 2227.

J. Riseman, "Structure for Cooling by Nucleate Boiling", IBM Technical Disclosure Bulletin, vol. 18, No. 11, Apr. 1976, p. 3700.

"Enhanced Cooling of Thermal Conduction Module", IBM Technical Disclosure Bulletin, vol. 30, No. 5, Oct. 1987, p. 426.

"Heat Exchanger Modules for Data Processor with Valves Operated by Pressure from Cooling Water Pump", IBM Technical Disclosure Bulletin, vol. 30, No. 5, Oct. 1987, p. 419.

"Cold Plate for Thermal Conduction Module with Inlet for Cooling Water Near Highest Power Chips", IBM Technical Disclosure Bulletin, vol. 30, No. 5, Oct. 1987, p. 413.

"Circuit Module Cooling with Coaxial Bellows Providing Inlet, Outlet and Redundant Connections to Water-Cooled Element", IBM Technical Bulletin, vol. 30, No. 5, Oct. 1987, pp. 345-347.

"Piping System with Valves Controlled by Processor for Heating Circuit Modules in a Selected Temperature Profile for Sealing Integrity Test Under Temperature Stress", IBM Technical Disclosure Bulletin, vol. 30, No. 5, Oct. 1987, p. 336.

"Cooling System for Chip Carrier on Card", IBM Technical Disclosure Bulletin, vol. 31, No. 4, Sep. 1988, pp. 39-40.

"Chip Cooling Device", IBM Technical Disclosure Bulletin, vol. 30, No. 9, Feb. 1988, pp. 435-436.

W. E. Ahearn et al., "Silicon Heat Sink Method to Control Integrated Circuit Chip Operating Temperatures", IBM Technical Disclosure Bulletin, vol. 21, No. 8, Jan. 1979, pp. 3378-3380.

W. J. Kleinfelder et al., "Liquid-Filled Bellows Heat Sink", IBM Technical Disclosure Bulletin, vol. 21, No. 10, Mar. 1979, pp. 4125-4126.

R. P. Chrisfield et al., "Distributed Power/Thermal Control", IBM Technical Disclosure Bulletin, vol. 22, No. 3, Aug. 1979, pp. 1131-1132.

A. J. Arnold, "Structure for the Removal of Heat from an Integrated Circuit Module", IBM Technical Disclosure Bulletin, vol. 22, No. 6, Nov. 1979, pp. 2294-2296.

U. P. Hwang et al., "Cold Plate for Thermal Conduction Module with Improved Flow Pattern and Flexible Base", IBM Technical Disclosure Bulletin, vol. 25, No. 9, Feb. 1983, p. 4517.

K. C. Gallagher et al., "Cooling System for Data Processor with Flow Restricter in Secondary Loop to Limit Bypass-Cooling Water Flow", IBM Technical Disclosure Bulletin, vol. 26, No. 5, Oct. 1983, p. 2658.

R. C. Chu et al., "Silicon Heat Sink for Semiconductor Chip", IBM Technical Disclosure Bulletin, vol. 24, No. 11A, Apr. 1982, p. 5743.

J. M. Eldridge et al., "Heat-Pipe Vapor Cooling Etched Silicon Structure", IBM Technical Disclosure Bulletin, vol. 25, No. 8, Jan. 1983, pp. 4118-4119.
J. R. Skobern, "Thermoelectrically Cooled Module", IBM Technical Disclose Bulletin, vol. 27, No. 1A, Jun. 1984, p. 30.
"Miniature Heat Exchanger for Corrosive Media", IBM Technical Disclosure Bulletin, vol. 38, No. 01, Jan. 1995, pp. 55-56.
"Self-Contained Active Heat Dissipation Device", IBM Technical Disclosure Bulletin, vol. 39, No. 04, Apr. 1996, pp. 115-116.
C. J. Keller et al., "Jet Cooling Cup for Cooling Semiconductor Devices", IBM Technical Disclosure Bulletin, vol. 20, No. 9, Feb. 1978, pp. 3575-3576.
B. J. Ronkese, "Centerless Ceramic Package with Directly Connected Heat Sink", IBM Technical Disclosure Bulletin, vol. 20, No. 9, Feb. 1978, p. 3577-3578.
K. S. Sachar, "Liquid Jet Cooling of Integrated Circuit Chips", vol. 20, No. 9, Feb. 1978, pp. 3727-3728.
A. H. Johnson, "Device Cooling", IBM Technical Disclosure Bulletin, vol. 20, No. 10, Mar. 1978, pp. 3919-3920.
R. D. Durand et al., "Flexible Thermal Conductor for Electronic Module", IBM Technical Disclosure Bulletin, vol. 20, No. 11A, Apr. 1978, p. 4343.
D. Balderes et al., "Liquid Cooling of a Multichip Module Package", IBM Technical Disclosure Bulletin, vol. 20, No. 11A, Apr. 1978, pp. 4336-4337.
J. A. Dorler et al., "Temperature Triggerable Fluid Coupling System for cooling Semiconductor Dies", IBM Technical Disclosure Bulletin, vol. 20, No. 11A, Apr. 1978, pp. 4386-4388.
V. W. Antonetti et al., "Integrated Module Heat Exchanger", IBM Technical Disclosure Bulletin, vol. 20, No. 11A, Apr. 1978, p. 4498.
P. Hwang et al., "Conduction Cooling Module", IBM Technical Disclosure Bulletin, vol. 20, No. 11A, Apr. 1978, pp. 4334-4335.
A. J. Arnold et al., "Electronic Packaging Structure", IBM Technical Disclosure Bulletin, vol. 20, No. 11B, Apr. 1978, pp. 4820-4822.
V. Y. Doo et al., "High Performance Package for Memory", IBM Technical Disclosure Bullletin, vol. 21, No. 2. Jul. 1978, pp. 585-586.
"Multi-Chip Package with Cooling by a Spreader Plate in Contact with a Chip having Cylindrical Holes Mating with an Inverse Frame Providing Water Flow Within its Pins", IBM Technical Disclosure Bulletin, vol. 31, No. 5, Oct. 1988, pp. 141-142.
J. Landrock et al., "Cooling System for Semiconductor Chips", IBM Technical Disclosure Bulletin, vol. 23, No. 4, Sep. 1980, p. 1483.
E. P. Damm, Jr., "Convection Cooling Apparatus", IBM Technical Disclosure Bulletin, vol. 20, No. 7, Dec. 1977, pp. 2755-2756.
"Circuit Package with Circulating Boiling Liquid and Local Heat Exchanger to Limit Vapor in Coolant Outlet", IBM Technical Disclosure Bulletin, vol. 31, No. 12, May 1989, p. 34.
"TCM-Like Circuit Module with Local Heat Sink Resting on Chip and Chip Separated From Coolant by Bellows with Pins and Deflector Plate Attached to Local Heat Sink and Extending Above Bellows into Region of Coolant Flow", IBM Technical Disclosure Bulletin, vol. 31, No. 11, Apr. 1989, pp. 305-306.
"Water-Cooled Circuit Module with Grooves Forming Water Passages Near Heat-Producing Devices", IBM Technical Disclosure Bulletin, vol. 31, No. 12, May 1989, pp. 49-50.
"Cold Plate for Thermal Conduction Module with Only Peripheral Mounting Bolts, Large Surface Area Fin Inserts and Reduced Water Flow and Thermal Resistances", IBM Technical Disclosure Bulletin, vol. 31, No. 12, May 1989, p. 59.
"Thermal Control Hardware for Accelerated Run-In Testing of Multi-Chip Modules", IBM Technical Disclosure Bulletin, vol. 32, No. 5A, Oct. 1989, p. 129-130.
"Means of Removing More Heat From a TCM (Or Other Liquid-Cooled Logic Package) By Reducing the Coolant Temperature", IBM Technical Disclosure Bulletin, vol. 32, No. 5A, Oct 1989, pp. 153-154.
E. G. Loeffel et al., "Liquid Cooled Module with Compliant Membrane", IBM Technical Disclosure Bulletin, vol. 20, No. 2, Jul. 1977, pp. 673-674.
V. Y. Doo et al., "Method of Effective Cooling of a High Power Silicon Chip", IBM Technical Disclosure Bulletin, vol. 20, No. 4, Sep. 1977, p. 1436-1437.
V.Y. Doo et al., Semiconductor Chip Cooling Package, IBM Technical Disclosure Bulletin, vol. 20, No. 4, Sep. 1977, pp. 1440-1441.
"Heat Sink Fabrication Method", IBM Technical Disclosure Bulletin, vol. 27, No. 10A, Mar. 1985, p. 5656-5657.
Thermal Conduction Module with Liquid Dielectric and Pistons with Surface Treatment.
Youngcheol Joo et al., "Fabrication of Monolithic Microchannels for IC Chip Cooling", 1995, IEEE Micro Electro Mechanical Systems, pp. 362-367.
Andreas Manz et al., "Electroosmotic pumping and electrophoretic separations for miniaturized chemical analysis systems", Sep. 16, 1994, J.Micromech. Microeng. 4 (1994), pp. 257-265, printed in the U.K.
E. B. Cummings et al., "Irrotationality of uniform electroosmosis", Sep. 1999, Part of the SPIE Conference on Microfluidic Devices and Systems II, SPIE vol. 3877, pp. 180-189.
Haim H. Bau, "Optimization conduits' shape in micro heat exchangers", Dec. 10, 1997, International Journal of Heat and Mass Transfer 41 (1998), pp. 2717-2723.
V. K. Dwivedi et al., "Fabrication of very smooth walls and bottoms of silicon microchannels for heat dissipation of semiconductor devices", Jan. 25, 2000, Microelectronics Journal 31 (2000), pp. 405-410.
M. B. Bowers et al., "Two-Phase Electronic Cooling Using Mini-Channel and Micro-Channel Heat Sinks: Part 2-Flow Rate and Pressure Drop Constraints", Dec. 1994, Journal of Electronic Packaging, vol. 116, pp. 298-305.
Meint J. de Boer et al., "Micromachining of Buried Micro Channels in Silicon", Mar. 2000, Journal of Microelectromechanical systems, vol. 9, No. 1, pp. 94-103.
S.B. Choi et al., "Fluid Flow and Heat Transfer in Microtubes", 1991, DSC-vol. 32, Micromechanical sensors, Actuators, and Systems, ASME 1991, pp. 123-134.
S. F. Choquette, M. Faghri et al., "Optimum Design of Microchannel Heat Sinks", DSC-vol. 59, Microelectromechanical Systems (MEMS), ASME 1996, pp. 115-126.
David Copeland et al., "Manifold Microchannel Heat Sinks: Theory and Experiment", EEP-vol. 10-2, Advances in Electronic Packaging ASME, 1995, pp. 829-835.
J. M. Cuta et al., "Forced Convection Heat Transfer in Parallel Channel Array Microchannel Heat Exchanger", PID-vol. 2 / HTD-vol. 338, Advances in Energy efficiency, Heat/Mass Transfer Enhancement, ASME 1996, pp. 17-23.
K. Fushinobu et al., "Heat Generation and Transport in Sub-Micron Semiconductor Devices", HTD-vol. 253, Heat Transfer on the Microscale, ASME 1993, pp. 21-28.
Charlotte Gillot et al., "Integrated Micro Heat Sink for Power Multichip Module", IEEE Transactions on Industry Applications, vol. 36, No. 1, Jan./Feb. 2000, pp. 217-221.
John Goodling, "Microchannel heat exchangers—a review", SPIE vol. 1997 High Heat Flux Engineering II (1993), pp. 66-82.
Koichiro Kawano et al., "Micro Channel Heat Exhanger for Cooling Electrical Equipment", HTD-vol. 361-3/PID-vol. 3, Proceedings of the ASME Heat Transfer Division—vol. 3, ASME 1998, pp. 173-188.
Chad Harris et al., "Design and Fabrication of a Cross Flow Micro Heat Exchanger", Dec. 2000, Journal of Microelectromechanical Systems, vol. 9, No. 4, pp. 502-508.
George M. Harpole et al., "Micro-Channel Heat Exchanger Optimization", 1991, Seventh IEEE SEMI-THERM Symposium, pp. 59-63.
Pei-Xue Jiang et al., "Thermal-hydraulic performance of small scale micro-channel and porous-media heat-exchangers", International Journal of Heat and Mass Transfer 44 (2001), pp. 1039-1051.
X.N. Jiang et al., "Laminar Flow Through Microchannels Used for Microscale Cooling Systems", 1997, IEEE/CPMT Electronic Packaging Technology Conference, pp. 119-122.
David Bazeley Tuckerman, "Heat-Transfer Microstructures for Integrated Circuits", Feb. 1984, pp. ii-xix, pp. 1-141.
M Esashi, "Silicon micromachining for integrated microsystems", Vacuum/vol. 47/Nos. 6-8/1996, pp. 469-474.
T.S. Ravigururajan et al., "Effects of Heat Flux on Two-Phase Flow Characteristics of Refrigerant Flows in a Micro-Channel Heat Exchanger", HTD-vol. 329, National Heat Transfer Conference, vol. 7, ASME 1996, pp. 167-178.

T.S. Ravigrururajan et al., "Single-Phase Flow Thermal Performance Characteristics of a Parallel Micro-Channel Heat Exchanger", HTD-vol. 329, National Heat Transfer Conference, vol. 7, ASME 1996, pp. 157-166.

T.S. Ravigururajan et al., "Liquid Flow Characteristics in a Diamond-Pattern Micro-Heat-Exchanger", DSC-vol. 59 Microelectromechanical Systems (MEMS), ASME 1996, pp. 159-166.

T.S. Ravigururajan, "Impact of Channel Geometry on Two-Phase Flow Heat Transfer Characteristics of Refrigerants in Microchannel Heat Exchangers", May 1998, Journal of Heat Transfer, vol. 120, pp. 485-491.

J. Pfahler et al., "Liquid Transport in Micron and Submicron Channels", Mar. 1990, Sensors and Actuators, A21-A23 (1990), pp. 431-434.

Kenneth Pettigrew et al., "Performance of a MEMS based Micro Capillary Pumped Loop for Chip-Level Temperature Control", 2001, The 14th IEEE International Conference on Micro Electro Mechanical Systems, pp. 427-430.

X.F. Peng et al., "Convective heat transfer and flow friction for water flow in microchannel structures", 1996, Int. J. Heat Mass Transfer, vol. 39, No. 12, pp. 2599-2608, printed in Great Britain.

X.F. Peng et al., "Experimental investigation of heat transfer in flat plates with microchannels", 1994, Int. J. Heat Mass Transfer, vol. 38, No. 1, pp. 127-137, printed in Great Britain.

X.F. Peng et al., "Cooling Characteristics with Microchanneled Structures", 1994, Enhanced Heat Transfer, vol. 1, No. 4, pp. 315-326.

X.F. Peng et al., "Enhancing the Critical Heat Flux Using Microchanneled Surfaces", 1998, Enhanced Heat Transfer, vol. 5, pp. 165-176, Printed in India.

Yoichi Murakami et al., "Parametric Optimization of Multichanneled Heat Sinks for VLSI Chip Cooling", Mar. 2001, IEEE Transactions on Components and Packaging Technologies, vol. 24, No. 1, pp. 2-9.

L.J. Missaggia et al., "Microchannel Heat Sinks for Two-Dimensional High-Power-Density Diode Laser Arrays", IEEE Journal of Quantum Electronics, vol. 25, No. 9, Sep. 1989, pp. 1988-1992.

M.J. Marongiu et al., "Enhancement of Multichip Modules (MCMs) Cooling by Incorporating MicroHeatPipes and Other High Thermal Conductivity Materials into Microchannel Heat Sinks", 1998, Electronic Components and Technology Conference, pp. 45-50.

C.R. Friedrich et al., "Micro heat exchangers fabricated by diamond machining", Jan. 1994, Precision Engineering, vol. 16, No. 1, pp. 56-59.

Mali Mahalingam, "Thermal Management in Semiconductor Device Packaging", Proceedings of the IEEE, vol. 73, No. 9, Sep. 1985, pp. 1396-1404.

T.M. Adams et al., "An experimental investigation of single-phase forced convection in microchannels", 1997, Int. J. Heat Mass Transfer, vol. 41, Nos. 6-7, pp. 851-857, Printed in Great Britain.

Bassam Badran et al., "Experimental Results for Low-Temperature Silicon Micromachined Micro Heat Pipe Arrays Using Water and Methanol as Working Fluids", May 31, 1997, Experimental Heat Transfer, 10: pp. 253-272.

D. Jed Harrison et al., "Electroosmotic Pumping Within A Chemical Sensor System Integrated on Silicon", Session C9 Chemical Sensors and Systems for Liquids, Jun. 26, 1991, pp. 792-795.

Kurt Seiler et al., "Electroosmotic Pumping and Valveless Control of Fluid Flow within a Manifold of Capillaries on a Glass Chip", 1994, Analytical Chemistry, vol. 66, No. 20, Oct. 15, 1994, pp. 3485-3491.

Philip H. Paul et al., "Electrokinetic Generation of High Pressures Using Porous Microstructures", 1998, Micro-Total Analysis Systems, pp. 49-52.

Gh. Mohiuddin Mala et al., "Flow characteristics of water through a microchannel between two parallel plates with electrokinetic effects", Oct. 1997, Int. J. Heat and Fluid Flow, vol. 18, No. 5, pp. 489-496.

W.E. Morf et al., "Partial electroosmotic pumping in complex capillary systems Part 1: Principles and general theoretical approach", Oct. 16, 2000, Sensors and Actuators B 72 (2001), pp. 266-272.

M. Esashi, "Silicon micromachining and micromachines", Wear, vol. 168, No. 1-2, (1993), pp. 181-187.

Stephanus Buttgenbach et al., "Microflow devices for miniaturized chemical analysis systems", Nov. 1998, SPIE-Chemical Microsensors and Applications, vol. 3539, pp. 51-61.

Sarah Arulanandam et al., "Liquid transport in rectangular microchannels by electroosmotic pumping", Colloids and Surfaces A: Physicochemical and Engineering Aspects, vol. 161 (2000), pp. 89-102.

Linan Jiang et al., "Closed-Loop Electroosmotic Microchannel Cooling System for VLSI Circuits", Mechanical Engineering Dept. Stanford University, pp. 1-27.

Susan L. R. Barker et al., "Fabrication, Derivatization and Applications of Plastic Microfluidic Devices", Proceedings of SPIE, vol. 4205, 2001, pp. 112-118.

Timothy E. McKnight et al., "Electroosmotically Induced Hydraulic Pumping with Integrated Electrodes on Microfluidic Devices", Aug. 15, 2001, Anal. Chem., vol. 73, No. 16, pp. 4045-4049.

Chris Bourne, "Cool Chips plc Receives Nanotech Manufacturing Patent", Jul. 31, 2002, pp. 1-2.

Frank Wagner et al., "Electroosmotic Flow Control in Micro Channels Produced by Scanning Excimer Laser Ablation", Proceedings of SPIE vol. 4088, 2000, pp. 337-340.

H. A. Goodman, "Data Processor Cooling With Connection To Maintain Flow Through Standby Pump", Dec. 1983, IBM Technical Disclosure Bulletin, vol. 26, No. 7A, p. 3325.

"Electroerosion Micropump", May 1990, IBM Technical Disclosure Bulletin, vol. 32, No. 12, pp. 342-343.

Shulin Zeng et al., "Fabrication and Characterization of Electrokinetic Micro Pumps", 2000 Inter Society Conference on Thermal Phenomena, pp. 31-35.

A. Manz et al., "Integrated Electroosmotic Pumps and Flow Manifolds for Total Chemical Analysis Systems", 1991, Inter. Conf. on Solid-State Sensors and Actuators, pp. 939-941.

O. T. Guenat et al., "Partial electroosmotic pumping in complex capillary systems Part: 2 Fabrication and application of a micro total analysis system suited for continuous volumetric nanotitrations", Sensors and Actuators B 72 (2001) pp. 273-282.

J. G. Sunderland, "Electrokinetic dewatering and thickening. I. Introduction and historical review of electrokinetic applications", Feb. 1987, Journal of Applied Electrochemistry, vol. 17, No. 5, pp. 889-898.

J. C. Rife et al., "Acousto- and electroosmotic microfluidic controllers", Sep. 1998, Microfluidic Devices and Systems, vol. 3515, pp. 125-135.

Purnendu K Dasgupta et al., "Electroosmosis: A Reliable Fluid Propulsion System for Flow Injection Analysis", Jun. 1994, Anal. Chem., vol. 66, No. 11, pp. 1792-1798.

Ray Beach et al., "Modular Microchannel Cooled Heatsinks for High Average Power Laser Diode Arrays", Apr. 1992, IEEE Journal of Quantum Electronics, vol. 28, No. 4, pp. 966-976.

Roy W. Knight et al., "Optimal Thermal Design of Air cooled Forced Convection Finned Heat Sinks—Experimental Verification", Oct. 1992, IEEE Transactions on Components, Hybrids, and Manufacturing Technology, vol. 15, No. 5, pp. 754-760.

Y. Zhuang et al., "Experimental study on local heat transfer with liquid impingement flow in two-dimensional micro-channels", 1997, Int. J. Heat Mass Transfer, vol. 40, No. 17, pp. 4055-4059.

D. Yu et al., "An Experimental and Theoretical Investigation of Fluid Flow and Heat Transfer in Microtubes", 1995, ASME / JSME Thermal Engineering Conference, vol. 1, pp. 523-530.

Xiaoqing Yin et al., "Micro Heat Exchangers Consisting of Pin Arrays", Journal of Electronic Packaging, Mar. 1997, vol. 119, pp. 51-57.

X. Yin et al., "Uniform Channel Micro Heat Exchangers", Journal of Electronic Packaging, Jun. 1997, vol. 119, pp. 89-94.

Chun Yang et al., "Modeling forced liquid convection in rectangular microchannels with electrokinetic effects", International Journal of Heat and Mass Transfer 41 (1998), pp. 4229-4249.

Arel Weisberg et al., "Analysis of microchannels for integrated cooling", 1992, Int. J. Heat Mass Transfer, vol. 35, No. 10, pp. 2465-2473.

Roger S. Stanley et al., "Two-Phase Flow in Microchannels", 1997, DSC-vol. 62/HTD-vol. 354, MEMS, pp. 143-152.

Kambiz Vafai et al., "Analysis of two-layered micro-channel heat sink concept in electronic cooling", Int. J. Heat Mass Transfer, 42 (1999), pp. 2287-2297.

Gokturk Tunc et al., "Heat transfer in rectangular microchannels", Int. J. Heat Mass Transfer, 45 (2002), pp. 765-773.

D. B. Tuckerman et al., "High-Performance Heat Sinking for VLSI", May 1981, IEEE Electron Device Letters, vol. EDL-2, No. 5, pp. 126-129.

Bengt Sunden et al., "An Overview of Fabrication Methods and Fluid Flow and Heat Transfer Characteristics of Micro Channels", pp. 3-23.

S. Sasaki et al., "Optimal Structure for Microgrooved Cooling Fin for High-Power LSI Devices", Electronic Letters, Dec. 4, 1986, vol. 22, No. 25.

Vijay K. Samalam, "Convective Heat Transfer in Microchannels", 1989, Journal of Electronic Materials, vol. 18, No. 5, pp. 611-617.

Sanjay K. Roy et al., "A Very High Heat Flux Microchannel Heat Exchanger for Cooling of Semiconductor Laser Diode Arrays", May 1996, IEEE Transactions on components, packaging, and manufacturing technology-part B, vol. 19, No. 2, pp. 444-451.

Charlotte Gillot et al., "Integrated Single and Two-Phase Micro Heat Sinks Under IGBT Chips", IEEE Transactions on Components and Packaging Technology, vol. 22, No. 3, Sep. 1999, pp. 384-389.

A.L. Pascuzzo et al., "Integrated Circuit Module Package Cooling Structure", IBM, vol. 20, No. 10, Mar. 1978, pp. 3898-3899.

H. Krumm, "Chip Cooling", IBM Technical Disclosure Bulletin, vol. 20, No. 7, Dec. 1977, p. 2728.

Jae-Mo Koo et al., "Modeling of Two-Phase Microchannel Heat Sinks for VLSI Chips", Mech. Eng. Depart. of Stanford University, pp. 422-426.

* cited by examiner

LIQUID COOLING LOOPS FOR SERVER APPLICATIONS

RELATED APPLICATIONS

This application claims priority of U.S. provisional application, Ser. No. 60/774,764, filed Feb. 16, 2006, and entitled "Thermal Interconnect", by these same inventors. This application incorporates U.S. provisional application, Ser. No. 60/774,764 in its entirety by reference.

FIELD OF THE INVENTION

The invention relates to a method of and apparatus for cooling a heat producing device in general, and specifically, to a method of and apparatus for cooling server applications using liquid-based cooling systems.

BACKGROUND OF THE INVENTION

Cooling of high performance integrated circuits with high heat dissipation is presenting significant challenge in the electronics cooling arena. Conventional cooling with heat pipes and fan mounted heat sinks are not adequate for cooling chips with every increasing wattage requirements, including those exceeding 100 W.

Electronics servers, such as blade servers and rack servers, are being used in increasing numbers due to the higher processor performance per unit volume one can achieve. However, the high density of integrated circuits also leads to high thermal density, which is beyond the capability of conventional air-cooling methods.

A particular problem with cooling integrated circuits on electronics servers is that multiple electronics servers are typically mounted in close quarters within a server chassis. In such configurations, electronics servers are separated by a limited amount of space, thereby reducing the dimensions within which to provide an adequate cooling solution. Typically, stacking of electronics servers does not provide the mounting of large fans and heat sinks for each electronics server. Often electronics server stacks within a single server chassis are cooled by one large fan, a heat sink or both. Using this configuration, the integrated circuits on each electronics server are cooled using the heat sink and the large fan that blows air over the heat sink, or simply by blowing air directly over the electronics servers. However, considering the limited free space surrounding the stacked electronics servers within the server chassis, the amount of air available for cooling the integrated circuits is limited.

Closed loop liquid cooling presents alternative methodologies for conventional cooling solutions. Closed loop cooling solutions more efficiently reject heat to the ambient than air cooling solutions.

What is needed is a more efficient cooling methodology for cooling integrated circuits on an electronics server. What is also needed is a more efficient cooling methodology for cooling integrated circuits on multiple electronics servers mounted within a server chassis.

SUMMARY OF THE INVENTION

Cooling systems of the present invention are directed to cooling solutions used to transfer heat produced by one or more heat generating devices, such as microprocessors or other integrated circuits, from one or more electronics servers to the ambient. In some embodiments, a liquid-based cooling system is used. A server chassis is configured to house multiple electronics servers. Examples of electronics servers includes, but are not limited to, blade servers and rack servers. Each electronics server is coupled to a backplane or mid-plane within the server chassis. For purposes of this disclosure, the terms "backplane" and "mid-plane" are used interchangeably. Each electronics server includes one or more heat generating devices. Integrated onto each electronics server is a liquid based cooling system. Each liquid based cooling system includes a server pump and one or more microchannel cold plates (MCP). Fluid lines preferably couple the MCPs and the server pump. In other embodiments, heat pipes or conduction means are used instead of the liquid-based cooling system.

In a first embodiment, the liquid based cooling system for each electronics server includes a rejector plate. Each rejector plate is configured with fluid channels, preferably microchannels. Alternatively, each rejector plate is configured with macro-channels. The fluid channels are coupled to the fluid lines thereby forming a first closed loop including the MCPs, the server pump and the rejector plate. The rejector plate is coupled to a chassis cold plate via a thermal interface material, thereby forming a thermal interface. The thermal interface is configured along a plane that is non-perpendicular to an insertion vector of the electronics server into a server rack chassis. In some embodiments, the thermal interface plane is parallel to the insertion vector. The rejector plates for each of the electronics servers are coupled to the chassis cold plate in this manner. The chassis cold plate includes one or more heat exchanging elements.

The chassis cold plate includes fluid channels which are coupled via fluid lines to a liquid-to-air heat exchanging system. The liquid-to-air heat exchanging system includes a heat rejector, one or more fans, and an external pump. The chassis cold plate, the heat rejector, the external pump, and fluid lines connected thereto form a second closed loop.

Fluid is pumped through the first closed loop such that heat generated by each heat generating device on the electronics server is transferred to the fluid flowing through each respective MCP coupled to the heat generating devices. The heated fluid flows into the fluid channels within the rejector plate. Within the second closed loop system, fluid is pumped through the fluid channels in the chassis cold plate by the external pump. Heat within the fluid flowing through each rejector plate is transferred through a thermal interface to the chassis cold plate and to the fluid flowing through the chassis cold plate. Heated fluid within the chassis cold plate is pumped to the heat rejector within the liquid-to-air heat exchanging system, where heat is transferred from the fluid to the air. Fluid flowing in the first closed loop system is independent of fluid flowing in the second closed loop system.

In a second embodiment, the liquid-to-air heat exchanging system of the first embodiment is replaced by an external water supply. In operation, fresh water from the external water supply flows to the chassis cold plate. Heat from the chassis cold plate is transferred to the water. The heated water flows from the chassis cold plate to the external water supply, where the heated water is disposed.

In a third embodiment, the chassis cold plate is modified with quick connects and the rejector plate is removed from each electronics server such that the fluid lines within the liquid based cooling system of each electronics server are coupled directly to the micro-channels within the chassis cold plate via the quick connects. The fluid lines within each liquid based cooling system are modified with appropriate fittings to couple with the quick connects on the chassis cold plate.

Other features and advantages of the present invention will become apparent after reviewing the detailed description of the embodiments set forth below.

BRIEF DESCRIPTION OF THE DRAWINGS

The present invention is described relative to the several views of the drawings. Where appropriate and only where identical elements are disclosed and shown in more than one drawing, the same reference numeral will be used to represent such identical elements.

DETAILED DESCRIPTION OF THE PRESENT INVENTION

Figure 1:
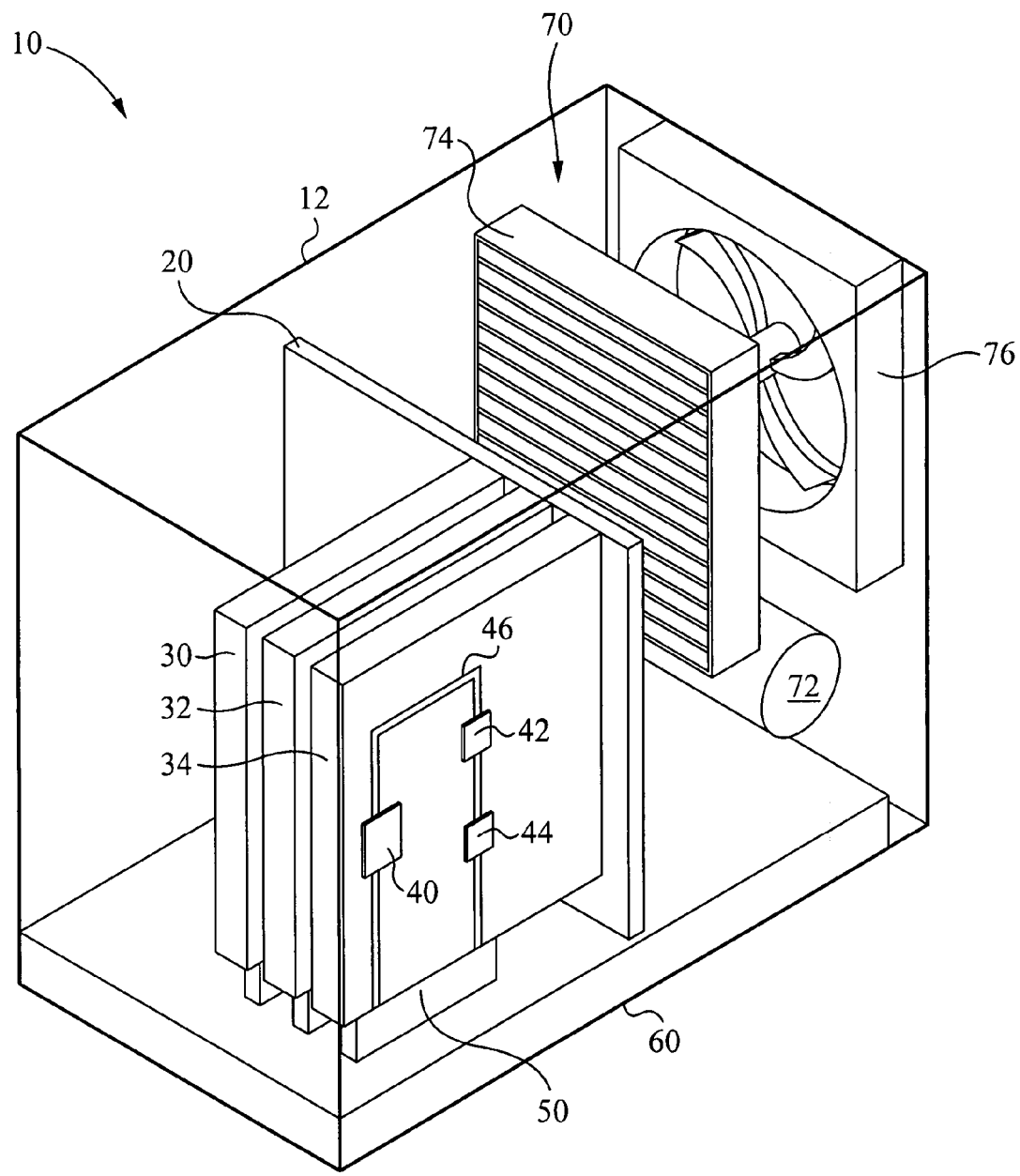
FIG. 1 illustrates a perspective view of an exemplary cooling system according to the first embodiment of the present invention.

Embodiments of the present invention are directed to a cooling system that transfers heat generated by one or more heat generating devices on a electronics server to a liquid-to-air heat exchanging system. The cooling system described herein can be applied to any electronics sub-system that is mounted to a backplane, including but not limited to, a blade server and a rack server. A server chassis is configured to house multiple electronics servers. Each electronics server is coupled to a backplane or mid-plane within the server chassis. Each electronics server includes one or more heat generating devices as is well known in the art. Integrated onto each electronics server is a cooling system. In some embodiments, the cooling system is a liquid-based cooling system. Each liquid-based cooling system includes a server pump and one or more microchannel cold plates (MCP). Preferably, each liquid-based cooling system is configured with one MCP for each heat generating device on the electronics server. The MCPs and the server pump are preferably mounted to the electronics server. Fluid lines couple the MCPs and the server pump. Alternatively, any means for transporting fluid within a sealed environment can be used. The server pump is any conventional pump, including, but not limited to, an electro-osmotic pump and a mechanical pump. In other embodiments, heat pipes or conduction means are used instead of the liquid-based cooling system.

In a first embodiment, the liquid based cooling system for each electronics server includes a rejector plate. The fluid lines coupling the MCPs and the server pump are also coupled to the rejector plate with fluid channels configured therein. The MCPs, the server pump, the rejector plate, and the fluid lines connected thereto form a first closed loop. Each server chassis includes at least one chassis cold plate. The rejector plate is coupled to the chassis cold plate via a thermal interface material. The rejector plates for each of the electronics servers are coupled to the chassis cold plate in this manner such that all rejector plates, and therefore the cooling system for each electronics server, are coupled to the chassis cold plate. Each electronics server is installed into a backplane along an insertion vector. The thermal interface between the rejector plate of the electronics server and the chassis cold plate is formed along a non-perpendicular plane relative to the insertion vector. In some embodiments, the thermal interface plane is parallel to the insertion vector. In order to couple the rejector plate to the chassis cold plate, a mounting mechanism is used.

The chassis cold plate includes fluid channels which are coupled via fluid lines to a liquid-to-air heat exchanging system. The liquid-to-air heat exchanging system includes a heat rejector, one or more fans, and an external pump. Fluid lines couple the chassis cold plate to the heat rejector, the heat rejector to the external pump, and the external pump to the chassis cold plate. The chassis cold plate, the heat rejector, the external pump, and the fluid lines connected thereto form a second closed loop. At least one blowing fan is preferably included to generate airflow over the surface of the heat rejector. The heat rejector is preferably a counter flow radiator. In some embodiments, the entire chassis cold plate and the liquid-to-air heat exchanging system is included within a single enclosure, such as the server housing. In other embodiments, a portion of the chassis cold plate extends external to the server housing and the liquid-to-air heat exchanging system is remotely located to the server housing.

In operation, within the liquid based cooling system for each electronics server, fluid is pumped through the fluid lines and the MCPs by the server pump such that heat generated by each heat generating device on the electronics server is transferred to the fluid flowing through each respective MCP coupled to the heat generating devices. Heat is transferred from the heat generating devices to the fluid flowing through the MCPs, and the heated fluid flows into the fluid channels within the rejector plate. Within the second closed loop system, fluid is pumped through the fluid channels in the chassis cold plate by the external pump. Thermal characteristics of the rejector plate, the chassis cold plate, and the thermal interface material between the rejector plate and the chassis cold plate are configured such that heat within the fluid flowing through each rejector plate is transferred to the fluid flowing through the chassis cold plate. Heated fluid within the chassis cold plate is pumped to the heat rejector within the liquid-to-air heat exchanging system, where heat is transferred from the fluid to the air. The cooled fluid exits the liquid-to-air heat exchanging system and is pumped back to the chassis cold plate.

FIG. 1 illustrates a perspective view of an exemplary cooling system 10 according to the first embodiment of the present invention. The cooling system 10 includes a chassis housing 12 for housing a back plane 20, a chassis cold plate 60, and a liquid-to-air heat exchanging system 70. The cooling system 10 is configured to cool up to N electronics servers. A first electronics server 30, a second electronics server 32, and an nth electronics server 34 are each mounted and electronically coupled to the back plane 20. For purposes of discussion, each electronics server 30, 32, 34 includes two processors. It is understood that each electronics server can be configured independently and that each electronics server can include more or less than two processors. Coupled to each electronics server 30, 32, 34 is a liquid based cooling system that includes at least one server pump 40, an MCP 42, an MCP 44, and a rejector plate 50. Preferably, the liquid based cooling system includes one MCP for each processor on the corresponding electronics server. In this exemplary case in which each electronics server 30, 32, 34 includes two processors, each liquid based cooling system includes two corresponding MCPs, preferably one per processor.

Preferably, the server pump 40 is a mechanical pump. Alternatively, the server pump 40 is an electro-osmotic pump. However, it is apparent to one skilled in the art that any type of pump is alternatively contemplated. Preferably, each MCP 42, 44 is a fluid-based, micro-channel heat exchanger of the type described in U.S. Pat. No. 7,000,684, which is hereby incorporated by reference. However, it is apparent to one skilled in the art that any type of fluid-based heat exchanger is alternatively contemplated. Preferably, the rejector plate 50 is configured with micro-channels that maximize a surface area exposed to a fluid passing therethrough.

A bottom surface of the rejector plate 50 is thermally coupled to a top surface of the chassis cold plate 60. In this manner, the rejector plate 50 for each electronics server 30, 32, 34 is thermally coupled to the chassis cold plate 60. The chassis plate 60 is preferably configured with micro-channels that maximize a surface area exposed to a fluid passing there through.

Each of the electronics servers 30, 32, 34 is coupled to the backplane 20 along an insertion vector. The insertion vector is perpendicular to the backplane 20. A thermal interface between the rejector plate 50 and the chassis cold plate 60 is formed along a non-perpendicular plane relative to the insertion vector. In some embodiments, the thermal interface plane is parallel to the insertion vector.

The liquid-to-air heat exchanging system 70 includes an external pump 72, a heat rejector 74, and a fan 76. The external pump 72 and the heat rejector 74 are coupled to the chassis cold plate 60. Preferably, the external pump 72 is a mechanical pump. Alternatively, the external pump 72 is an electro-osmotic pump. However, it is apparent to one skilled in the art that any type of pump is alternatively contemplated. The heat rejector 74 is preferably a radiator with micro-channels and fins positioned closely together. More preferably, the heat rejector 74 is a counter flow radiator of the type described in U.S. Pat. No. 6,988,535, which is hereby incorporated by reference. However, it is apparent to one skilled in the art that any type of heat rejector is alternatively contemplated. The fan 76 comprises one or more blowing fans for generating air flow across and/or through the heat rejector 74.

Figure 2:
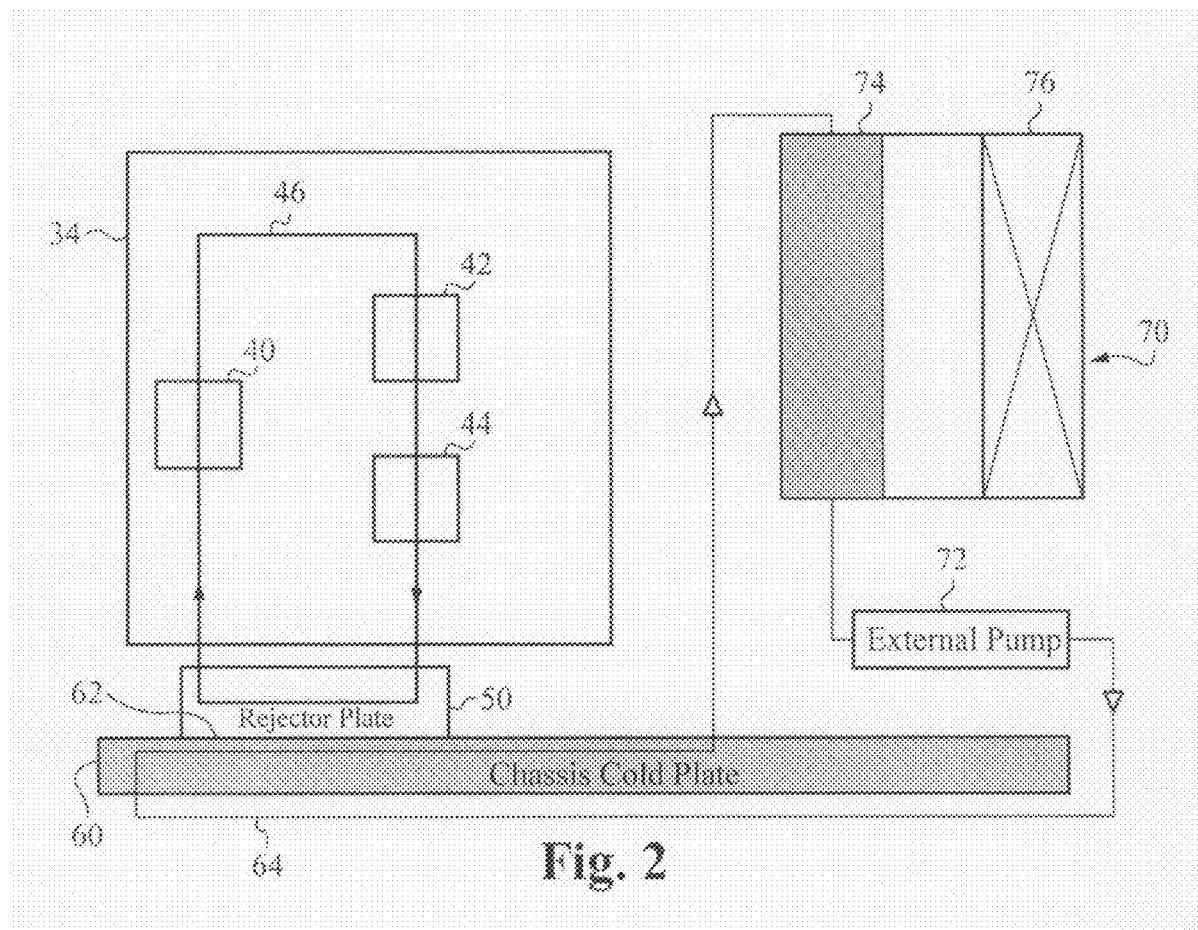
FIG. 2 illustrates a side view of the nth electronics server coupled to the liquid-to-air heat exchanging system.

FIG. 2 illustrates a side view of the nth electronics server 34 coupled to the liquid-to-air heat exchanging system 70. As shown in FIG. 2, the server pump 40 is coupled to the MCP 42 by one or more fluid lines 46. The MCP 42 is coupled to the MCP 44 by one or more fluid lines 46. The MCP 44 is coupled to the rejector plate 50 by one or more fluid lines 46. The rejector plate 50 is coupled to the server pump 40 by one or more fluid lines 46. The fluid lines 46 are metallic or non-metallic.

Although the MCP 42 and the MCP 44 are shown in FIG. 2 as being coupled in series, alternative configurations are also contemplated. For example, each MCP within a given liquid based cooling system can be configured in parallel such that fluid reaching any of the MCPs has not previously passed through, and been heated by, another MCP. In this manner, fluid reaching any MCP configured in parallel is cooler than if the fluid first passes through a serially connected MCP. In such an alternative configuration, the server pump 40 is coupled to the MCP 42 by one or more fluid lines 46, and separate fluid lines couple the server pump 40 to the MCP 44. In this alternative embodiment, one or more fluid lines couple the MCP 42 to the rejector plate 50 and one or more fluid lines couple the MCP 44 to the rejector plate 50. Alternatively, the one or more fluid lines leaving the MCP 42 and the one or more fluid lines leaving the MCP 44 are joined prior to coupling with the rejector plate 50. In yet other alternative configurations, multiple MCPs are configured in any combination of series and parallel configurations.

The MCP 42, the MCP 44, the rejector plate 50, the server pump 40, and the fluid lines 46 form a first closed loop through which fluid flows. A function of the liquid-based cooling system of FIG. 2, which includes the first closed loop, is to capture heat generated by the two processors (not shown) on the electronics server 34. The MCP 42 is thermally coupled to a first processor on the electronics server 34. Similarly, the MCP 44 is thermally coupled to a second processor on the electronics server 34. As fluid flows through the MCP 42, heat from the first processor is transferred to the fluid. As fluid flows through the MCP 44, heat from the second processor is transferred to the fluid.

The type of fluid used in the liquid-based cooling system is preferably water-based. Alternatively, the fluid within the liquid-based cooling system is based on combinations of organic solutions, including but not limited to propylene glycol, ethanol and isopropanol (IPA). Still alternatively, the fluid within the liquid-based cooling system is a pumped refrigerant. The fluid used in the liquid-based cooling system also preferably exhibits a low freezing temperature and has anti-corrosive characteristics. Depending on the operating characteristics of the liquid-based cooling system and the electronics server processors, in one embodiment, the fluid exhibits single phase flow while circulating within the liquid-based cooling system. In another embodiment, the fluid is heated to a temperature to exhibit two phase flow, wherein the fluid undergoes a phase transition from liquid to a vapor or liquid/vapor mix.

The heated fluid flows from the MCPs 42, 44 into the micro-channels within the rejector plate 50. Heat is transferred from the heated fluid within the micro-channels to the material of the rejector plate 50. A thermal interface material 62 provides efficient heat transfer between the rejector plate 50 and the chassis cold plate 60 so that heat from the rejector plate 50 is transferred to the material of the chassis cold plate 60. The thermal interface material 62 is preferably a compliant material such as thermal grease, solder, or any type of thermally conducting gap filling material.

As shown in FIG. 2, the chassis cold plate 60 is coupled to the external pump 72 by one or more fluid lines 64. The chassis cold plate 60 is coupled to the heat rejector 74 by one or more fluid lines 64. The heat rejector 74 is coupled to the external pump 72 by one or more fluid lines 64. The fluid lines 64 are metallic or non-metallic. The chassis cold plate 60, the heat rejector 74, the external pump 72, and the fluid lines 64 form a second closed loop through which fluid flows. The fluid in second closed loop preferably comprise the same type of fluid discussed above in relation to the first closed loop. The fluid in the second closed loop is independent of the fluid in the first closed loop.

A function of the second closed loop and the liquid-to-air heat exchanging system 70 is to transfer heat from the chassis cold plate 60 to the ambient. As fluid flows through the micro-channels within the chassis cold plate 60, heat from material of the chassis cold plate 60 is transferred to the fluid. The heated fluid flows to the heat rejector 74.

As the heated fluid flow through the heat rejector 74, heat is transferred from the fluid to the material of the heat rejector 74. The fan 76 blows air over the surface of the heat rejector 74 such that heat is transferred from the heat rejector 74 to the ambient. Preferably, the chassis 12 (FIG. 1) includes intake vents and exhaust vents through which air enters and leaves the cooling system 10 (FIG. 1). Cooled fluid leaving the heat rejector 74 flows back to the chassis cold plate 60.

Figure 3:
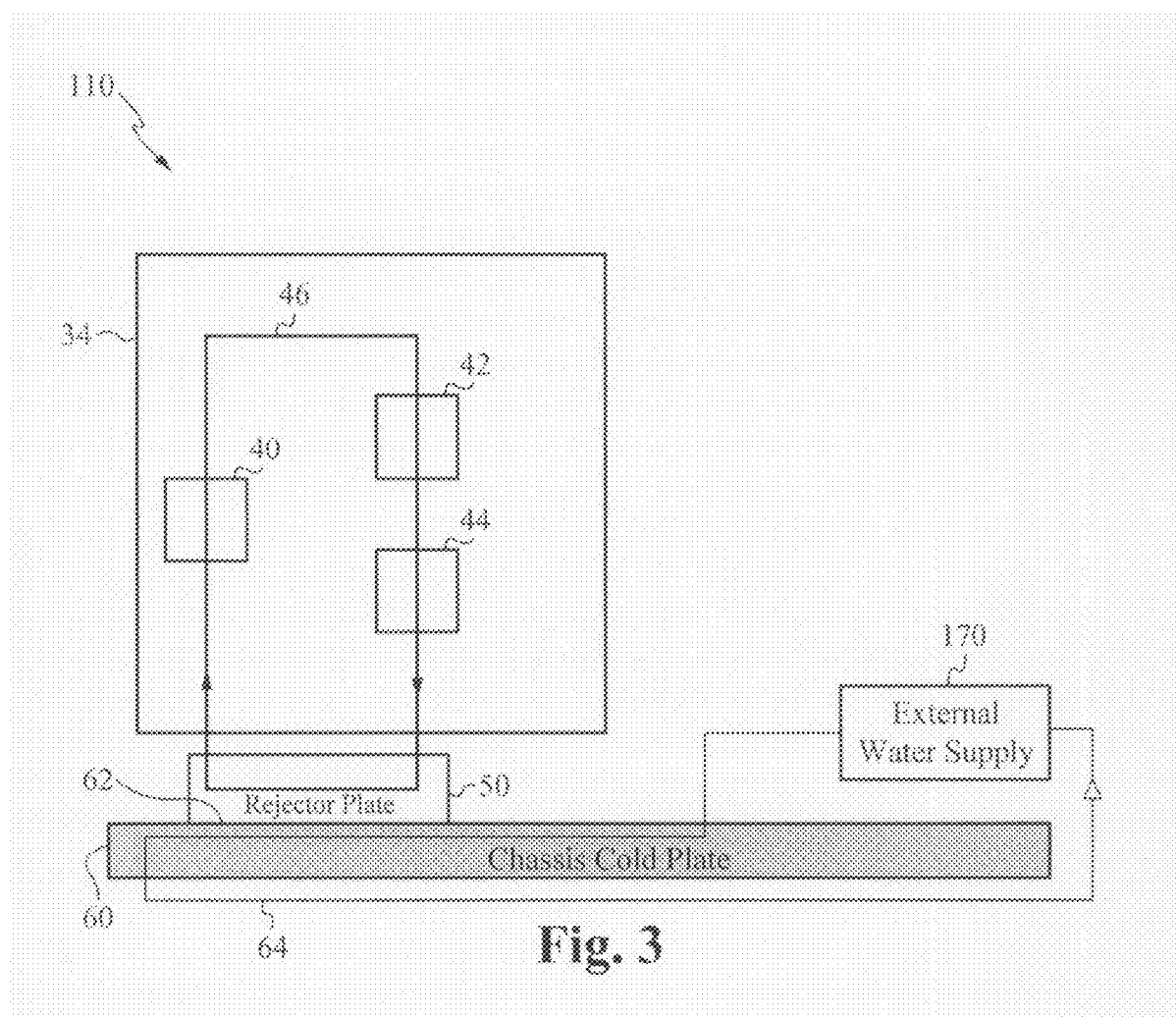
FIG. 3 illustrates a side view of an exemplary cooling system according to a second embodiment of the present invention.

FIG. 3 illustrates a side view of an exemplary cooling system according to a second embodiment of the present invention. The cooling system 110 can be identical to the cooling system 10 of FIG. 1 with the exception that the liquid-to-air heat exchanging system 70 (FIG. 1) of cooling system 10 is replaced by an external water supply 170. The external water supply 170 represents a continuous running water supply, such as the public water supply provided to most commercial and residential facilities. Alternatively, the external water supply 170 represents an external source of any type of fluid to which heat is transferred. In operation of the cooling system 110, fresh water from the external water supply 170 flows to the chassis cold plate 60. Heat from the chassis cold plate 60 is transferred to the water in the same manner as that described in relation to cooling system 10 (FIG. 1). The heated water flows from the chassis cold plate 60 to the external water supply 170, where the heated water is disposed. Pressure from the water entering the fluid lines 64 from the external water supply 170 is sufficient to circulate the water through the chassis cold plate 60 and back to the external water supply for disposal. Alternatively, an external pump is coupled to the fluid lines 64 between the external water supply 170 and the chassis cold plate 60 to pump the water to the chassis cold plate 60.

Figure 4:
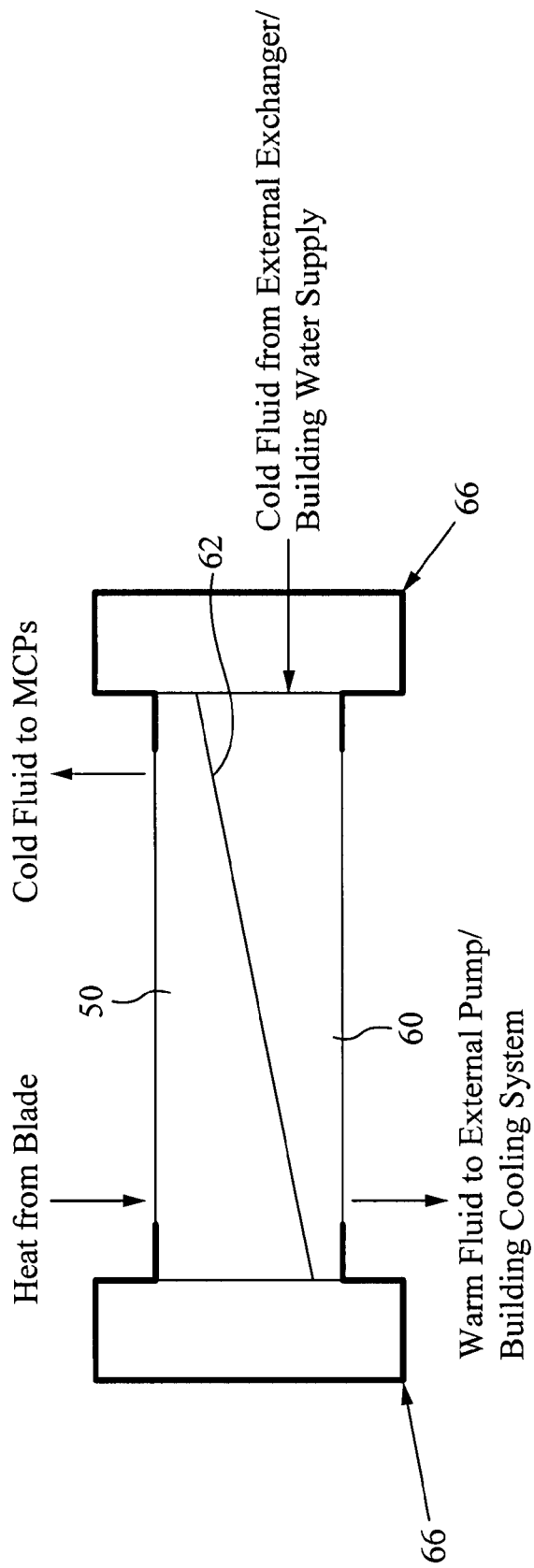
FIG. 4 illustrates an exemplary heat transfer configuration between a mating surface of the rejector plate and a mating surface of the chassis cold plate.

In both the cooling system 10 (FIG. 1) and the cooling system 110 (FIG. 3), heat conduction between the first closed loop (the electronics server loop) and the second closed loop (the external cooling loop) plays a role in the overall thermal performance of the cooling system. FIG. 4 illustrates an exemplary embodiment of a heat transfer configuration between a mating surface of the rejector plate 50 and a mating surface of the chassis cold plate 60 coupled together via the thermal interface material 62. In the configuration shown in FIG. 4, the two mating surfaces of the rejector plate 50 and the chassis cold plate 60 are configured as wedges. A thick portion of the rejector plate wedge 50 is aligned with a thin portion of the chassis cold plate wedge 60. A thin portion of the rejector plate wedge 50 is aligned with a thick portion of the chassis cold plate wedge 60. By sliding the electronics server into the back plane the wedge shapes cause pressure between the rejector plate wedge 50 and the chassis cold plate 60. This pressure serves to form an enhanced thermal interface. In the first closed loop, heated fluid flows from the MCPs 42 and 44 (FIGS. 2 and 3) to the thick portion of the rejector plate wedge 50. Cooled fluid flows out of the thin portion of the rejector plate wedge 50 to the server pump 40 (FIGS. 2 and 3). In the second closed loop, fluid flows from the liquid-to-air heat exchanging system 170 (FIG. 2), or the external water supply 170 (FIG. 3), to the thick portion of the chassis cold plate wedge 60. Heated fluid flows out of the thin portion of the chassis cold plate 60 to the liquid-to-air heat exchanging system 70 (FIG. 2), or the external water supply 170 (FIG. 3). Each of the rejector plate wedge 50 and the chassis cold plate wedge 60 include channeled features to enable efficient heat transfer from the flowing fluid of the first closed loop, to the wedge interface, the flowing fluid of the second closed loop. In alternative embodiments, the rejector plate 50 and the chassis cold plate 60 are configured using dimensions and shapes different than wedges.

A mounting mechanism 66 secures the rejector plate wedge 50 to the chassis cold plate 60. The mounting mechanism 66 can include clips, screw, or any other conventional retention mechanism.

In a third embodiment, the chassis cold plate is modified with quick connects and the rejector plate is removed from each electronics server such that the fluid lines within the liquid based cooling system of each electronics server are coupled directly to the micro-channels within the chassis cold plate via the quick connects. The fluid lines within each liquid based cooling system are modified with appropriate fittings to couple with the quick connects on the chassis cold plate. In an alternative configuration of the third embodiment, the quick connects are configured onto the fluid lines of the liquid based cooling system, and the chassis cold plate is configured with appropriate fittings to couple with the quick connects on each electronics server.

Figure 5:
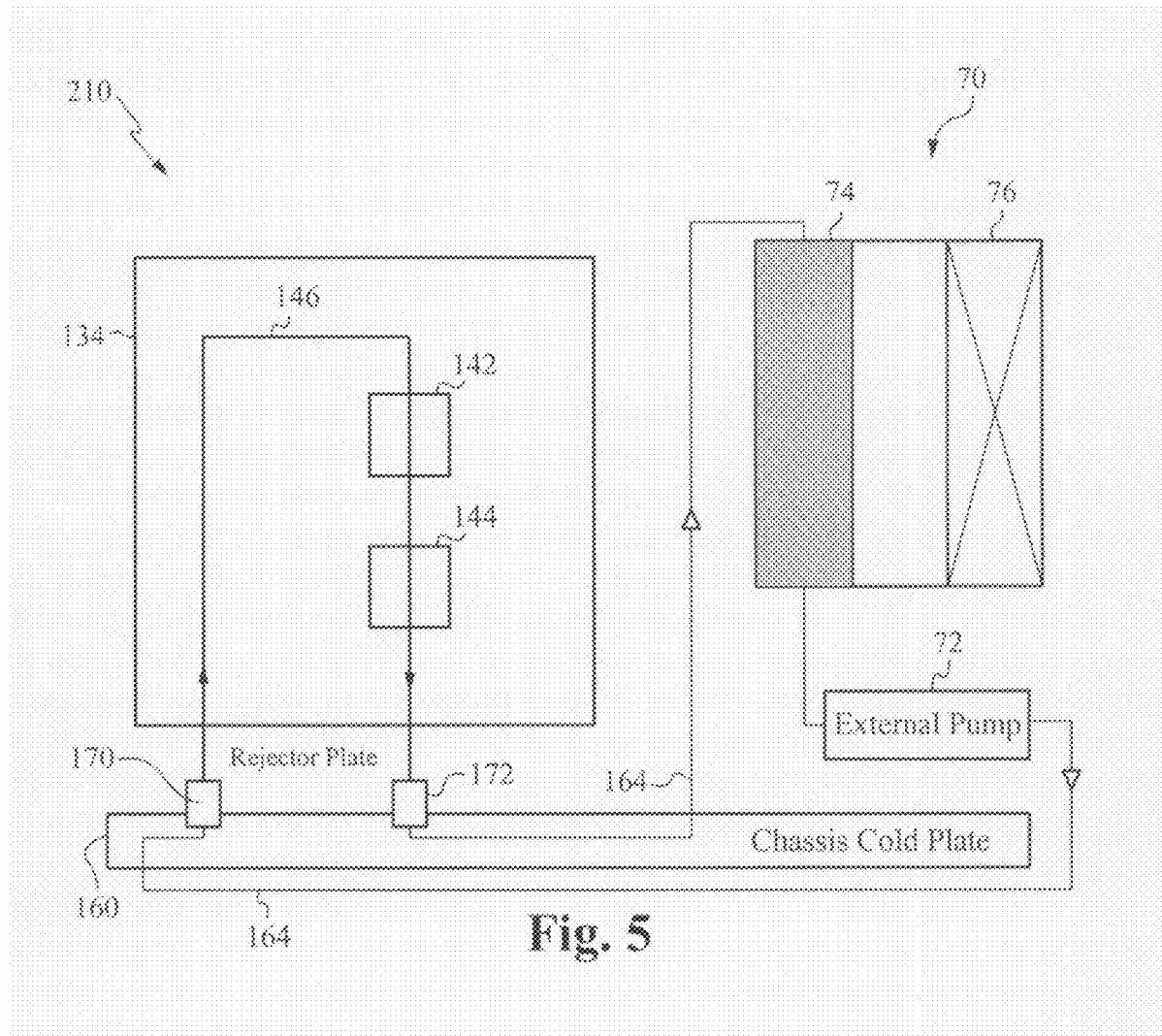
FIG. 5 illustrates a side view of an exemplary cooling system according to the third embodiment of the present invention.

FIG. 5 illustrates a side view of an exemplary cooling system 210 according to the third embodiment of the present invention. Although cooling system 210 is shown in FIG. 5 as including only a single electronics server 134, it is understood that the cooling system 210 also includes a chassis housing (not shown) and a back plane (not shown) configured to hold up to N electronics servers in a manner similar to that described in relation to cooling system 10 in FIG. 1. For purposes of discussion, each electronics server within the cooling system 210 is described as including two processors. It is again understood that each electronics server in the cooling system 210 can be configured independently and that each electronics server can include more or less than two heat generating devices, such as processors.

A liquid based cooling system is coupled to the electronics server 134. The liquid based cooling system includes an MCP 142 and an MCP 144 coupled together via one or more fluid lines 146. The liquid based cooling system includes one MCP coupled to each processor on the electronics server 134. Each MCP 142, 144 is functionally equivalent to the MCPs 42, 44 (FIGS. 1-3)

The cooling system 210 includes the liquid-to-air heat exchanging system 70 coupled to a chassis cold plate 160 via one or more fluid lines 164. The chassis cold plate 160 is configured with micro-channels that enhance a surface area exposed to a fluid passing there through. The chassis cold plate 160 is also configured with quick connects 170 and 172. The fluid lines 146 are configured with appropriate fittings to couple with the quick connects 170 and 172. In the cooling system 210, the fluid lines 146 are coupled directly to the micro-channels of the chassis cold plate 160 via the quick connects 170, 172. In this manner, the liquid based cooling system coupled to electronics server 134, the chassis cold plate 160, the heat rejector 74, the external pump 72, and the fluid lines 164 form a single closed loop. Within this closed loop, the fluid is pumped by the external pump 72. The type of fluid used in the cooling system of the third embodiment is the same type of fluid used in the cooling system 10 of the first embodiment.

Although FIG. 5 shows a single quick connect 170 through which fluid flows from the chassis cold plate 160 to the fluid lines 146, the quick connect 170 is representative of one or more physical quick connects through which fluid flows from the micro-channels in the chassis cold plate 160 to the one or more fluid lines 146. Similarly, although FIG. 5 shows a single quick connect 172 through which fluid flows from the fluid lines 146 to the chassis cold plate 160, the quick connect 172 is representative of one or more physical quick connects through which fluid flows from the one or more fluid lines 146 to the micro-channels in the chassis cold plate 160.

Although the MCP 142 and the MCP 144 are shown in FIG. 5 as being coupled in series, alternative configurations are also contemplated. For example, each MCP within a given liquid based cooling system is configured in parallel. In such an alternative configuration, the quick connects 170 are coupled to the MCP 142 by one or more fluid lines 146, and separate fluid lines couple the quick connects 170 to the MCP 144. In this alternative embodiment, one or more fluid lines couple the MCP 142 to the quick connects 172 and one or more fluid lines couple the MCP 144 to the quick connects 172. Alternatively, there is not a one to one relationship between the number of quick connects 170 to the number of MCPs in the liquid based cooling system, and there is not a one to one relationship between the number of MCPs and the number of quick connects 172. In yet other alternative configurations, multiple MCPs are configured in any combination of series and parallel configurations.

A function of the liquid-based cooling system of FIG. 5, which includes the MCPs 142, 144 and the fluid lines 146, is to capture heat generated by the two processors (not shown) on the electronics server 134. The MCP 142 is thermally coupled to a first processor on the electronics server 134. Similarly, the MCP 144 is thermally coupled to a second processor on the electronics server 134. As fluid flows through the MCP 142, heat from the first processor is transferred to the fluid. As fluid flows through the MCP 144, heat from the second processor is transferred to the fluid.

The heated fluid flows from the fluid lines 146 into the micro-channels within the chassis cold plate 160 via the quick connect 172. As shown in FIG. 5, the chassis cold plate 160 is coupled to the external pump 72 by one or more fluid lines 164. In addition, the chassis cold plate 160 is coupled to the heat rejector 74 by one or more fluid lines 164. The heated fluid in the micro-channels of the chassis cold plate 160 flows to the heat rejector 74 via fluid lines 164. The fluid lines 164 are metallic or non-metallic.

As previously described, a function of the liquid-to-air heat exchanging system 70 is to transfer heat from a fluid to the ambient. As the heated fluid flow through the heat rejector 74, heat is transferred from the fluid to the material of the heat rejector 74. The fan 76 blows air over the outer surface of the heat rejector such that heat is transferred from the heat rejector 74 to the ambient. Cooled fluid leaving the heat rejector 74 flows back to the chassis cold plate 160 via fluid lines 164. The cooled fluid flows through the chassis cold plate 160 to the fluid lines 146 via the quick connect 170. The cooled fluid flows to the MCPs 142 and 144.

It is apparent to one skilled in the art that the present cooling system is not limited to the components shown in FIG. 1-5 and alternatively includes other components and devices. For example, although not shown in FIG. 1, the cooling system 10 can also include a fluid reservoir coupled to either the closed loop of the liquid based cooling system, the closed loop of the chassis cold plate 60, the heat rejector 74, the external pump 72, and the fluid lines 64, or both closed loops. The fluid reservoir accounts for fluid loss over time due to permeation.

When connecting an electronics server to a rack system through the use of quick disconnects, additionally factors are to be considered. One consideration is that such a liquid connection is made in the data room. Anytime a connection is made or broken, there is a chance for a leak. The connection also usually occurs as a separate step from the electrical connections which occur when the electronics server is inserted and locked into the rack. As a separate connection, this is not fail safe. For example, the processor can be turned on without having connected the cooling loop causing an overheating event or damage to the CPU. Another consideration is that if the cooling loop is correctly connected, the cooling loop on the electronics server will share the same fluid as the full rack system. Sharing the rack system fluid can lead to reliability issues, specifically clogging. The length scales of features in an efficient heat exchanger used to transfer heat from a processor are measured in microns. Chilled water lines can have scale and other particulate which may not be an issue at rack level cooling but can quickly clog a heat exchanger at the board level. Another consideration is that the level of control of materials used for larger scale cooling applications is also different then that for a electronics server cooling loop and corrosion may become an issue. For the independent cooling loop systems described above in relation to FIGS. 2 and 3, these considerations are eliminated.

Additionally, although each of the embodiments described above in regards to FIGS. 1-5 are directed to liquid-based cooling systems, alternative cooling systems, such as heat pipes and conduction means, can be used.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

What is claimed is:

1. A cooling system for cooling a plurality of electronics servers, the cooling system comprising:
  a. a plurality of electronics servers, each electronics server including one or more heat generating devices;
  b. a plurality of fluid based cooling systems, one fluid based cooling system thermally coupled to a corresponding electronics server, wherein each fluid based cooling system includes at least one heat exchanging device through which flows a first fluid to receive heat transferred from the one or more heat generating devices of the corresponding electronics server, and each fluid based cooling system further includes a heat rejector through which the first fluid flows to transfer heat from the first fluid to the heat rejector;
  c. a second heat exchanging system including a single cold plate through which flows a second fluid separate from the first fluid and a liquid-to-air heat rejector; and
  d. a thermal interface formed between the heat rejector of each of the plurality of fluid based cooling systems and the single cold plate of the second heat exchanging system to transfer heat from the first fluid to the second fluid, wherein each of the plurality of electronics servers is configured to be inserted along an insertion vector into an electronics chassis, and wherein the thermal interface is disposed along a thermal interface plane that is non-perpendicular to the insertion vector.

2. The cooling system of claim 1 wherein each fluid based cooling system forms a first closed fluid loop.

3. The cooling system of claim 1 wherein the first fluid is physically isolated from the second fluid.

4. The cooling system of claim 1 wherein the cold plate is configured with fluid channels.

5. The cooling system of claim 1 wherein the liquid-to-air heat rejector and the thermal interface form a second closed fluid loop.

6. The cooling system of claim 5 wherein the second heat exchanging system further comprises a first pump, wherein the first pump is included in the second closed fluid loop.

7. The cooling system of claim 1 wherein the heat rejector of each fluid based cooling system includes a rejector plate, wherein each rejector plate is configured with micro-channels.

8. The cooling system of claim 7 wherein the thermal interface layer further comprises a thermal interface material to couple each rejector plate to the cold plate.

9. The cooling system of claim 1 wherein the liquid-to-air heat rejector comprises a radiator.

10. The cooling system of claim 1 wherein the at least one heat exchanging device of each fluid based cooling system comprises one or more microchannel cold plates through which the first fluid flows.

11. The cooling system of claim 10 wherein one microchannel cold plate is coupled to each heat generating device.

12. The cooling system of claim 1 wherein each fluid based cooling system further comprises a second pump.

13. The cooling system of claim 1 wherein each electronics server comprises a blade server.

14. The cooling system of claim 1 wherein each electronics server comprises a rack server, and the electronics chassis comprises an electronics rack.

15. A cooling system for cooling an electronics server, the cooling system comprising:
   a. a electronics server including one or more heat generating devices;
   b. a fluid based cooling system including one or more first heat exchangers and a first heat rejector, each first heat exchanger is thermally coupled to one of the heat generating devices, wherein the fluid based cooling system includes a first fluid loop including the one or more first heat exchangers and the first heat rejector, the first fluid loop having a first fluid circulating therethrough to receive heat transferred from the one or more heat generating devices;
   c. a second heat exchanging system including a second fluid loop with a second fluid, wherein the second fluid loop includes a second heat exchanger and a second heat rejector, further wherein the second heat exchanger is thermally coupled to the first heat rejector; and
   d. a thermal interface formed between the first heat rejector of the fluid based cooling system and the second heat exchanger of the second heat exchanging system to transfer heat from the first fluid to the second fluid,
wherein the electronics server is configured to be inserted along an insertion vector into an electronics chassis, and wherein the entire thermal interface is disposed along a single thermal interface plane that is non-perpendicular and non-parallel to the insertion vector.

16. The cooling system of claim 15 wherein the fluid based cooling system forms a first closed fluid loop.

17. The cooling system of claim 15 wherein the first fluid is physically isolated from the second fluid.

18. The cooling system of claim 15 wherein the thermal interface includes a chassis cold plate, wherein the chassis cold plate is configured with fluid channels.

19. The cooling system of claim 15 wherein the heat rejector and the thermal interface form a second closed fluid loop.

20. The cooling system of claim 19 wherein the second heat exchanging system further comprises a first pump, wherein the first pump is included in the second closed fluid loop.

21. The cooling system of claim 15 wherein the fluid based cooling system includes a rejector plate configured with micro-channels.

22. The cooling system of claim 21 wherein the thermal interface layer further comprises a thermal interface material to couple the rejector plate to the chassis cold plate.

23. The cooling system of claim 15 wherein the heat rejector comprises a radiator.

24. The cooling system of claim 15 wherein the fluid based cooling system further comprises one or more microchannel cold plates through which the first fluid flows.

25. The cooling system of claim 24 wherein one microchannel cold plate is coupled to each heat generating device on the electronics server.

26. The cooling system of claim 15 wherein the fluid based cooling system further comprises a second pump.

27. The cooling system of claim 15 further comprising a plurality of electronics servers, each electronics server including one or more heat generating devices, and a plurality of fluid based cooling systems, one fluid based cooling system thermally coupled to a corresponding electronics server, wherein each of the plurality of fluid based cooling systems is thermally coupled to the thermal interface.

28. The cooling system of claim 15 wherein each electronics server comprises a blade server.

29. The cooling system of claim 15 wherein each electronics server comprises a rack server, and the electronics chassis comprises an electronics rack.

30. A cooling system for cooling an electronics server, the cooling system comprising:
   a. a electronics server including one or more heat generating devices;
   b. a fluid based cooling system thermally coupled to the electronics server, wherein the fluid based cooling system includes a first fluid to receive heat transferred from the one or more heat generating devices;
   c. a non-circulating an external fluid supply to provide a new supply of a second fluid; and
   d. a thermal interface coupled to the fluid based cooling system and to the external fluid supply to receive the fresh supply of the second fluid and to transfer heat from the first fluid to the second fluid,
wherein the electronics server is configured to be inserted along an insertion vector into an electronics chassis, and wherein the thermal interface is disposed along a thermal interface plane that is non-perpendicular to the insertion vector.

31. The cooling system of claim 30 wherein the fluid based cooling system forms a first closed fluid loop.

32. The cooling system of claim 30 wherein the first fluid is physically isolated from the second fluid.

33. The cooling system of claim 30 wherein the thermal interface includes a chassis cold plate, wherein the chassis cold plate is configured with fluid channels.

34. The cooling system of claim 30 further comprises a first pump coupled between the external fluid supply and the thermal interface.

35. The cooling system of claim 30 wherein the fluid based cooling system includes a rejector plate configured with micro-channels.

36. The cooling system of claim 35 wherein the thermal interface layer further comprises a thermal interface material to couple the rejector plate to the chassis cold plate.

37. The cooling system of claim 30 wherein the fluid based cooling system further comprises one or more microchannel cold plates through which the first fluid flows.

38. The cooling system of claim 37 wherein one microchannel cold plate is coupled to each heat generating device on the electronics server.

39. The cooling system of claim 30 wherein the fluid based cooling system further comprises a second pump.

40. The cooling system of claim 30 further comprising a plurality of electronics servers, each electronics server including one or more heat generating devices, and a plurality of fluid based cooling systems, one fluid based cooling system thermally coupled to a corresponding electronics server, wherein each of the plurality of fluid based cooling systems is thermally coupled to the thermal interface.

41. The cooling system of claim 30 wherein the external fluid supply comprises an external water supply that provides a new supply of water.

42. The cooling system of claim 30 wherein each electronics server comprises a blade server.

43. The cooling system of claim 30 wherein each electronics server comprises a rack server, and the electronics chassis comprises an electronics rack.

44. A cooling system for cooling an electronics server, the cooling system comprising:
  a. a electronics server including one or more heat generating devices;
  b. a fluid based cooling system thermally coupled to the electronics server, wherein the fluid based cooling system includes a fluid to receive heat transferred from the one or more heat generating devices;
  c. a second heat exchanging system including a heat rejector; and
  d. a thermal interface coupled to the fluid based cooling system and to the second heat exchanging system to direct the fluid to the heat rejector to transfer heat from the fluid to the air, wherein the electronics server is configured to be inserted along an insertion vector into an electronics chassis, and wherein the entire thermal interface is disposed along a single thermal interface plane that is non-perpendicular and non-parallel to the insertion vector.

45. The cooling system of claim 44 wherein the fluid based cooling system, the thermal interface, and the heat rejector form a closed fluid loop.

46. The cooling system of claim 44 wherein the thermal interface includes a chassis cold plate, wherein the chassis cold plate is configured with fluid channels.

47. The cooling system of claim 44 wherein the second heat exchanging system further comprises a pump, wherein the pump is included in the closed fluid loop.

48. The cooling system of claim 44 wherein the heat rejector comprises a radiator.

49. The cooling system of claim 44 wherein the fluid based cooling system further comprises one or more microchannel cold plates through which the fluid flows.

50. The cooling system of claim 49 wherein one microchannel cold plate is coupled to each heat generating device on the electronics server.

51. The cooling system of claim 44 further comprising a plurality of electronics servers, each electronics server including one or more heat generating devices, and a plurality of fluid based cooling systems, one fluid based cooling system thermally coupled to a corresponding electronics server, wherein each of the plurality of fluid based cooling systems is coupled to the thermal interface to enable fluid flow from each of the plurality of fluid based cooling systems to the thermal interface.

52. The cooling system of claim 51 wherein each of the plurality of fluid based cooling systems is coupled to the thermal interface via a plurality of quick connects.

53. The cooling system of claim 44 wherein each electronics server comprises a blade server.

54. The cooling system of claim 44 wherein each electronics server comprises a rack server, and the electronics chassis comprises an electronics rack.

\* \* \* \* \*

UNITED STATES PATENT AND TRADEMARK OFFICE
CERTIFICATE OF CORRECTION

PATENT NO. : 7,599,184 B2  Page 1 of 1
APPLICATION NO. : 11/707350
DATED : October 6, 2009
INVENTOR(S) : Upadhya et al.

It is certified that error appears in the above-identified patent and that said Letters Patent is hereby corrected as shown below:

ON THE TITLE PAGE

Item (75) Inventors, please replace "Los Alos Hills, CA" with "Los Altos Hills, CA" so that the field correctly reads Item -- (75) Inventors:  Girish Upadhya, Cupertino, CA (US);
Mark Munch, Los Altos Hills, CA (US);
Norman Chow, Milpitas, CA (US);
Paul Tsao, Los Altos, CA (US);
Douglas E. Werner, Santa Clara, CA (US);
Mark McMaster, Menlo Park, CA (US);
Frederic Landry, San Francisco, CA (US);
Ian Spearing, Westerville, OH (US);
Tim Schrader, Irwin, OH (US) --

In Claim 30, at column 12, line 26, please delete "an" from before the "external" so that the claim limitation reads -- c. a non-circulating external fluid supply to provide a new supply of a second fluid; and --

Signed and Sealed this

Seventeenth Day of November, 2009

David J. Kappos
*Director of the United States Patent and Trademark Office*